(12) United States Patent
Shigemori et al.

(10) Patent No.: US 12,024,053 B2
(45) Date of Patent: Jul. 2, 2024

(54) BATTERY MANAGEMENT SYSTEM

(71) Applicant: DENSO CORPORATION, Kariya (JP)

(72) Inventors: Shogo Shigemori, Kariya (JP); Takeshi Iida, Kariya (JP); Tatsuhiro Numata, Kariya (JP)

(73) Assignee: DENSO CORPORATION, Kariya (JP)

( * ) Notice: Subject to any disclaimer, the term of this patent is extended or adjusted under 35 U.S.C. 154(b) by 106 days.

(21) Appl. No.: 17/674,116

(22) Filed: Feb. 17, 2022

(65) Prior Publication Data
US 2022/0266714 A1 Aug. 25, 2022

(30) Foreign Application Priority Data

Feb. 24, 2021 (JP) ................................. 2021-027775
Nov. 15, 2021 (JP) ................................. 2021-185846

(51) Int. Cl.
*B60L 58/12* (2019.01)
*G01R 31/382* (2019.01)
(Continued)

(52) U.S. Cl.
CPC ............ *B60L 58/12* (2019.02); *G01R 31/382* (2019.01); *H01M 10/425* (2013.01); *H01M 10/482* (2013.01); *H01M 2010/4271* (2013.01)

(58) Field of Classification Search
CPC .......... B60L 58/12; B60L 50/66; B60L 58/10; B60L 50/64; B60L 2270/147;
(Continued)

(56) References Cited

U.S. PATENT DOCUMENTS

2016/0268642 A1 9/2016 Yamazoe et al.
2017/0161786 A1 6/2017 Terazaki et al.
(Continued)

FOREIGN PATENT DOCUMENTS

JP 2018-181361 A 11/2018
JP 2019-36850 A 3/2019
(Continued)

OTHER PUBLICATIONS

"Visteon announces first production-intent wireless battery management technology", Oct. 29, 2020 (Year: 2020).*
(Continued)

*Primary Examiner* — Daniel R Miller
(74) *Attorney, Agent, or Firm* — Posz Law Group, PLC

(57) ABSTRACT

A battery management system includes monitoring devices arranged in a housing that houses batteries and a control device. The monitoring device includes (i) a monitoring IC capable of acquiring battery information and (ii) a wireless IC. At a start-up time of the plurality of monitoring devices, each of the wireless ICs performs an advertising operation in a cyclic advertising event for establishing a connection of wireless communication between the plurality of monitoring devices and the control device, and the control device performs a scan operation. The wireless IC of each of the two or more monitoring devices has, respectively, an event management unit that manages a generation cycle of the adverting event, for performing the advertising operation at respectively different timings.

9 Claims, 17 Drawing Sheets

(51) Int. Cl.
  *H01M 10/42* (2006.01)
  *H01M 10/48* (2006.01)
(58) Field of Classification Search
  CPC .............. G01R 31/382; H01M 10/425; H01M 10/482; H01M 2010/4271; H01M 2010/4278; Y02E 60/10; H02J 7/00036; H02J 7/0047
  See application file for complete search history.

(56) References Cited

U.S. PATENT DOCUMENTS

| | | |
|---|---|---|
| 2018/0349959 A1 | 12/2018 | Terazaki et al. |
| 2018/0375984 A1 | 12/2018 | Otani |
| 2020/0057114 A1* | 2/2020 | Fujii ................ H01M 10/4207 |
| 2020/0106278 A1* | 4/2020 | Sung .................... H02J 7/0047 |
| 2021/0204338 A1 | 7/2021 | Han et al. |
| 2021/0281988 A1 | 9/2021 | Han et al. |
| 2022/0200069 A1* | 6/2022 | Asami ................ G01R 31/3842 |

FOREIGN PATENT DOCUMENTS

| | | |
|---|---|---|
| WO | 2015/189898 A1 | 12/2015 |
| WO | 2018/101419 A1 | 6/2018 |

OTHER PUBLICATIONS

K, R. K. Nema and A. Ojha, "Various Types of Wireless Battery Management System in Ev," 2020 IEEE International Students' Conference on Electrical, Electronics and Computer Science (SCEECS), Bhopal, India, 2020 (Year: 2020).*

M. Lee, J. Lee, I. Lee, J. Lee and A. Chon, "Wireless battery management system," 2013 World Electric Vehicle Symposium and Exhibition (EVS27), Barcelona, Spain, 2013, pp. 1-5 (Year: 2013).*

* cited by examiner

BATTERY MANAGEMENT SYSTEM

CROSS REFERENCE TO RELATED APPLICATION

The present application is based on and claims the benefit of priority of Japanese Patent Application No. 2021-027775, filed on Feb. 24, 2021, and No. 2021-185846, filed on Nov. 15, 2021, the disclosure of which are incorporated herein by reference.

TECHNICAL FIELD

The present disclosure generally relates to a battery management system.

BACKGROUND INFORMATION

A comparative battery management system is housed in a housing together with a battery to be monitored (i.e., together with a monitored object) in consideration of mountability to a vehicle or the like. That is, a plurality of battery cell management devices (i.e., monitoring devices) and an assembled battery management device (i.e., a control device) that constitute the battery management system are arranged in the housing that houses the batteries. In such manner, wireless communication is performed between the plurality of monitoring devices and one control device in the housing. When a plurality of monitoring devices are activated at a start-up time, each of the monitoring devices cyclically performs an advertising operation, which may cause radio wave interference. Further improvements are required in the battery management system in the above-mentioned viewpoint or in other viewpoints not mentioned.

SUMMARY

It is an object of the present disclosure to provide a battery management system capable of suppressing radio wave interference at start-up.

The disclosed aspects in the specification adopt different technical solutions from each other in order to achieve their respective objectives. The objects, features, and advantages disclosed in the specification will become apparent by referring to following detailed descriptions and accompanying drawings.

BRIEF DESCRIPTION OF THE DRAWINGS

Objects, features, and advantages of the present disclosure will become more apparent from the following detailed description made with reference to the accompanying drawings, in which.

DETAILED DESCRIPTION

Figure 1:
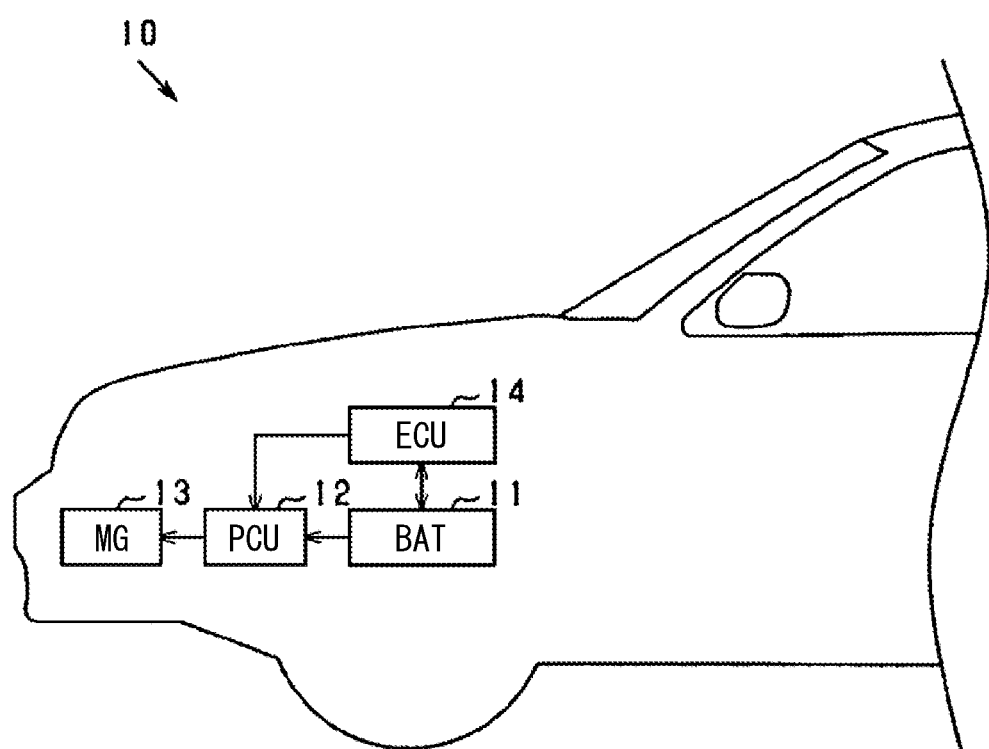
FIG. 1 is a diagram showing a vehicle equipped with a battery pack.

Hereinafter, multiple embodiments are described with reference to the drawings. The same reference numerals are assigned to the corresponding elements in each embodiment, and thus, duplicate descriptions may be omitted. In each of the embodiments, when only a part of the configuration is described, the remaining parts of the configuration may adopt corresponding parts of other embodiments. Further, not only the combinations of the configurations explicitly shown in the description of the respective embodiments, but also the configurations of the plurality of embodiments can be partially combined even when they are not explicitly shown as long as there is no difficulty in such combination in particular.

First Embodiment

First, based on FIG. 1, a vehicle equipped with a battery management system according to the present embodiment, particularly, a configuration regarding a battery pack provided with the battery management system is described. FIG. 1 is a diagram showing a schematic configuration of a vehicle. The vehicle is an electric-powered vehicle such as an electric vehicle or a hybrid vehicle.

<Vehicle>

As shown in FIG. 1, a vehicle 10 includes a battery pack (BAT) 11, a PCU 12, an MG 13, and an ECU 14. PCU is an abbreviation for Power Control Unit. MG is an abbreviation for Motor Generator. "ECU" is an abbreviation for "Electronic Control Unit."

The battery pack 11 includes an assembled battery 20, which is described later, and provides a DC voltage source that can be charged and discharged. The battery pack 11 supplies electric power to an electric load of the vehicle 10. The battery pack 11 supplies power to the MG 13 through the PCU 12. The battery pack 11 is charged through the PCU 12. The battery pack 11 may sometimes be referred to as a main battery.

The battery pack 11 is located in a front compartment of the vehicle 10, for example, as shown in FIG. 1. The battery pack 11 may also be located in a rear compartment, under a seat, under a floor, and the like. For example, in case of a hybrid vehicle, a compartment in which the engine is located may sometimes be referred to as an engine compartment or an engine room.

The PCU 12 performs bi-directional power conversion between the battery pack 11 and the MG 13 according to a control signal from the ECU 14. The PCU 12 may sometimes be referred to as a power converter. The PCU 12 includes, for example, an inverter. The inverter converts a DC voltage into an AC voltage, for example, into a three-phase AC voltage, and outputs the AC voltage to the MG 13. The inverter converts the generated electric power of the MG 13 into a DC voltage and outputs it to the converter. The PCU 12 may include a converter. The converter is arranged in an energization path between the battery pack 11 and the inverter. The converter has a function of raising and lowering the DC voltage.

The MG 13 is an AC rotating electric machine, for example, a three-phase AC synchronous motor in which a permanent magnet is embedded in a rotor. The MG 13 functions as a traveling power source for the vehicle 10, that is, an electric motor. The MG 13 is driven by the PCU 12 to generate a rotational driving force. The driving force generated by the MG 13 is transmitted to driving wheels. The MG 13 functions as a generator when the vehicle 10 is braked, and performs regenerative power generation. The generated power of the MG 13 is supplied to the battery pack 11 through the PCU 12 and stored in the assembled battery 20 in the battery pack 11.

The ECU 14 is configured to include a computer including a processor, a memory, an input/output interface, a bus connecting them, and the like. The processor is hardware for arithmetic processing. The processor includes, for example, a CPU as a core. CPU is an abbreviation for Central Processing Unit. A memory is a non-transitory, substantive storage medium that non-temporarily stores or memorizes programs and data that can be read by a computer. The memory stores various programs executed by the processor.

The ECU 14 acquires information about the assembled battery 20 from the battery pack 11, for example, and controls the PCU 12 to control the drive of the MG 13 and the charging/discharging of the battery pack 11. The ECU 14 may acquire information such as voltage, temperature, electric current, SOC (State of Charge), and SOH (State of Health) of the assembled battery 20 from the battery pack 11. The ECU 14 may acquire battery information such as voltage, temperature, and electric current of the assembled battery 20 to calculate SOC and SOH. SOC is an abbreviation for State Of Charge. SOH is an abbreviation for State Of Health.

The processor of the ECU 14 executes a plurality of instructions included in, for example, a PCU control program stored in a memory. As a result, the ECU 14 constructs a plurality of functional units for controlling the PCU 12. In the ECU 14, a plurality of functional units are constructed/provided by causing a processor to execute a plurality of instructions under control of a program stored in a memory. The ECU 14 may be referred to as an EV ECU.

<Battery Pack>

Figure 2:
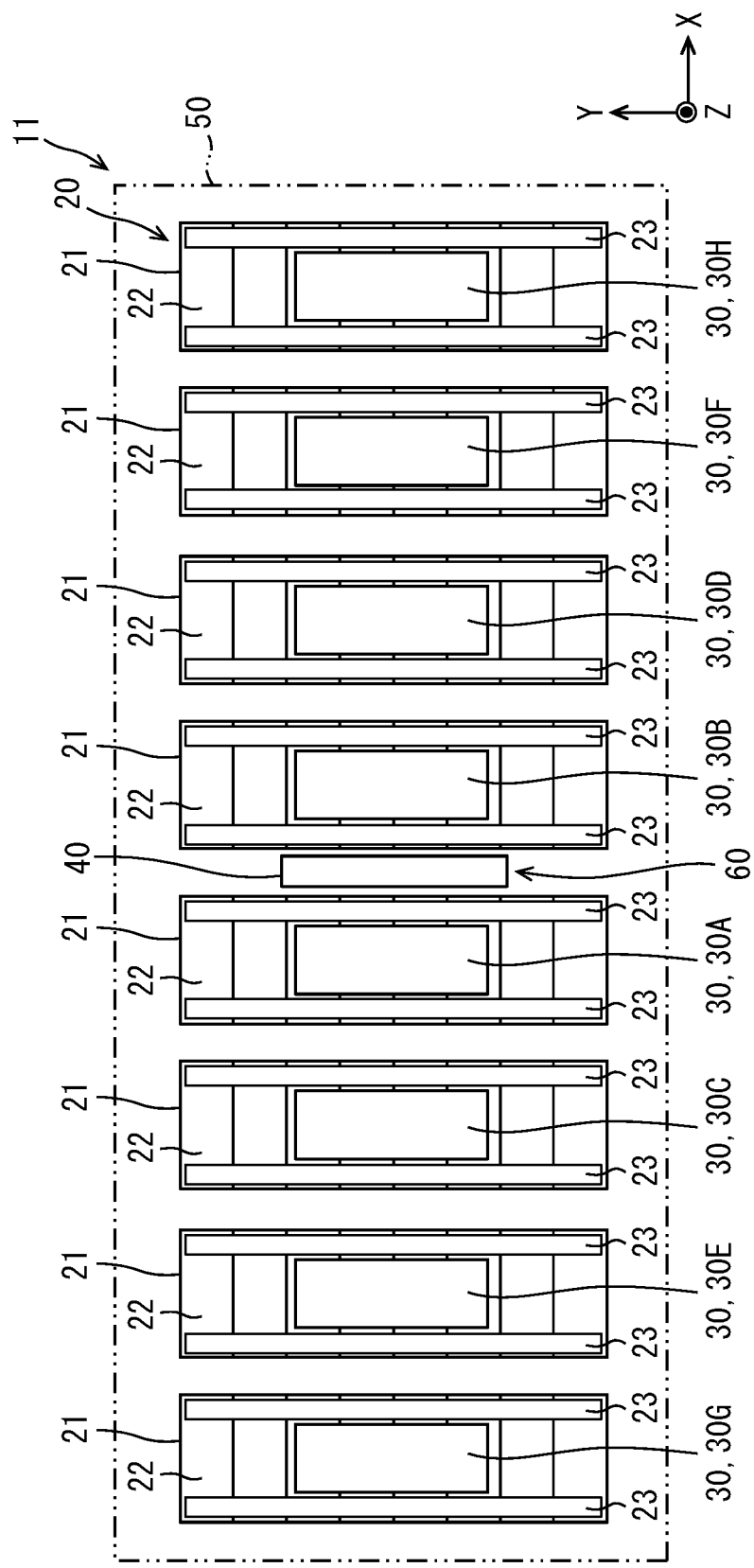
FIG. 2 is a plan view showing a schematic configuration of a battery pack including the battery management system according to a first embodiment.

Next, an example of the configuration of the battery pack 11 is described with reference to FIG. 2. FIG. 2 is a plan view showing an internal structure of the battery pack 11. In FIG. 2, the housing is indicated by a two-dot chain line.

As shown in FIG. 2, the battery pack 11 includes an assembled battery 20, a plurality of monitoring devices 30, a control device 40, and a housing 50.

The housing 50 houses other elements constituting the battery pack 11, that is, the assembled battery 20, the monitoring device 30, and the control device 40. The housing 50 may be formed using a metal material or a resin material. The housing 50 may have a metal part and a resin part. The housing 50 has a substantially rectangular parallelepiped shape. In FIG. 2, a longitudinal direction of a mounting surface of the housing 50 on the vehicle 10 is indicated as the X direction, and a lateral direction thereof is indicated as the Y direction. Further, a vertical direction perpendicular to the mounting surface is indicated as the Z direction. The X direction, the Y direction, and the Z direction are in a positional relationship orthogonal to each other. In the following, unless otherwise specified, a shape viewed in a plane from the Z direction, that is, a shape along an XY plane defined by the X and Y directions is referred to as a plane shape. Further, a plan view seen from the Z direction may simply be referred to as a plan view.

In the present embodiment, a left-right direction of the vehicle 10 corresponds to the X direction, a front-rear direction corresponds to the Y direction, and the vertical direction corresponds to the Z direction. A direction from a battery stack 21 toward the monitoring device 30 is an upward direction, and a direction from the monitoring device 30 toward the battery stack 21 is a downward direction. The mounting surface of the housing 50 on the vehicle 10 is a downward surface with respect to the battery stack 21. The arrangement of FIG. 2 may only be an example, and the battery pack 11 may be arranged in any direction with respect to the vehicle 10.

The assembled battery 20 has a plurality of battery stacks 21 arranged side by side in the X direction. The battery stack 21 may also be referred to as a battery block or a battery module. The assembled battery 20 is configured by connecting a plurality of battery stacks 21 in series. Each battery stack 21 has a plurality of battery cells 22. The battery stack 21 has a plurality of battery cells 22 connected in series. The battery stack 21 of the present embodiment is configured by connecting a plurality of battery cells 22 arranged side by side in the Y direction in series. The assembled battery 20 provides the above-mentioned DC voltage source. The assembled battery 20, the battery stack 21, and the battery cell 22 correspond to a battery.

The battery cell 22 is a secondary battery that generates an electromotive voltage by a chemical reaction. As the secondary battery, for example, a lithium ion secondary battery or a nickel hydrogen secondary battery can be adopted. A lithium ion secondary battery is a secondary battery using lithium as a charge carrier. In addition to a general lithium ion secondary battery in which the electrolyte is liquid, a so-called all-solid-state battery using a solid electrolyte can also be included.

On an upper surface of each battery stack 21, linear bus bar units 23 are arranged at both ends in the X direction. That is, a pair of bus bar units 23 are arranged in each battery stack 21. The bus bar unit 23 electrically connects a plurality of battery cells 22. Each battery cell 22 is formed in a flat shape, and is laminated/layered so that side surfaces overlap each other in the Y direction. The battery cell 22 has positive electrode terminals and negative electrode terminals (not shown) that project in the Z direction, more specifically in the upward direction, at both ends in the X direction. The battery cells 22 are laminated so that the positive electrode terminals and the negative electrode terminals are alternately arranged in the Y direction.

Each bus bar unit 23 has a plurality of bus bars and bus bar covers (not shown). The bus bar is a plate member made of a metal having good electrical conductivity such as copper. The bus bar electrically connects the positive electrode terminal and the negative electrode terminal of the adjacent battery cells 22 in the Y direction. As a result, in each battery stack 21, a plurality of battery cells 22 are electrically connected in series. Note that, in each battery stack 21, a positive electrode terminal of the battery cell 22 arranged on one end in the Y direction is connected to a predetermined positive electrode wiring, and a negative electrode terminal of the battery cell 22 arranged on the other end in the Y direction is connected to a predetermined negative electrode wiring.

The bus bar cover is formed by using an electrically insulating material such as resin. The bus bar cover is provided linearly from one end to the other of the battery stack 21 along the Y direction so as to cover the plurality of bus bars.

The monitoring device 30 is provided for each of the plurality of battery stacks 21. As shown in FIG. 2, the monitoring device 30 is arranged between a pair of bus bar units 23 in each battery stack 21. The monitoring device 30 is fixed to the bus bar unit 23 with screws or the like. The monitoring device 30 has a circuit board (not shown), and is fixed so that a thickness direction of the circuit board substantially coincides with the Z direction. As is described later, the monitoring device 30 is configured to enable wireless communication with the control device 40. An antenna 37, which is described later, included in the monitoring device 30 is arranged so as not to overlap the bus bar unit 23 in the Z direction, that is, to project upward from the bus bar unit 23 in the Z direction.

The control device 40 is arranged at a position between the battery stacks 21 in the X direction. The control device 40 has a circuit board (not shown), and a thickness direction of the circuit board is arranged to substantially coincide with the X direction. The control device 40 may be fixed to a side surface of the battery stack 21, for example, or may be fixed to a lower surface of the housing 50. The control device 40 is configured to enable wireless communication with each of the monitoring devices 30. An antenna 42, which is described later, included in the control device 40 is arranged substantially at the same height as the antenna 37 of the monitoring device 30 in the Z direction. That is, the antenna 42 included in the control device 40 is provided so as to protrude from the bus bar unit 23 in the Z direction.

In the battery pack 11, the monitoring device 30 and the control device 40 provide a battery management system 60. That is, the battery pack 11 is equipped with the battery management system 60.

<Positional Relationship Between Monitoring Device and Control Device>

Figure 3:
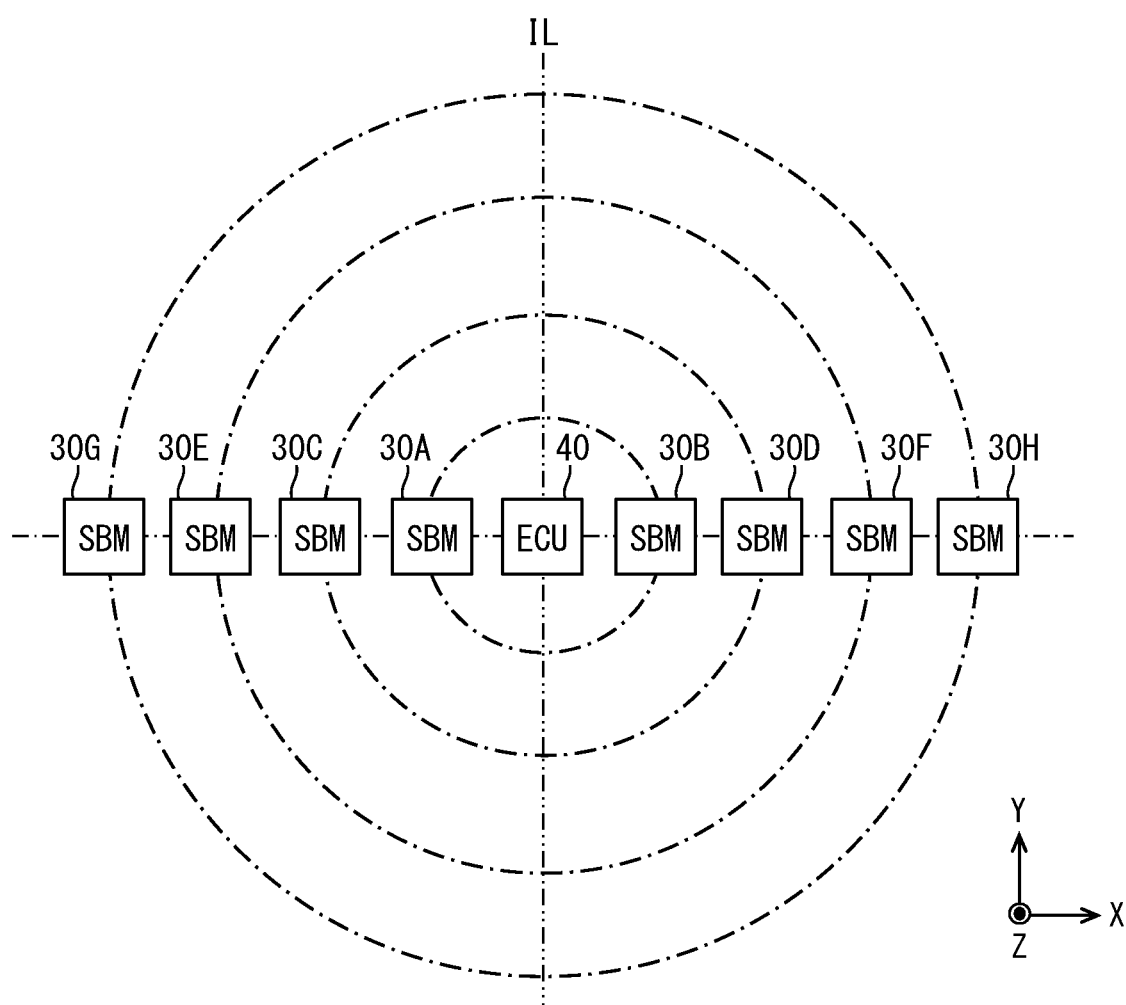
FIG. 3 is a diagram showing a positional relationship between a monitoring device and a control device.

Next, the positional relationship between the plurality of monitoring devices 30 and the control device 40 housed in the housing 50 is described with reference to FIGS. 2 and 3. FIG. 3 is a diagram showing the positional relationship between the plurality of monitoring devices 30 and the control device 40 in the battery pack 11 shown in FIG. 2. In FIG. 3, the monitoring device 30 is shown as an SBM, and the control device 40 is shown as an ECU. SBM is an abbreviation for Satellite Battery Module. In FIG. 3, in a plan view, a virtual circle centered on the control device 40 is shown by a one-dot chain line. In a plan view, a virtual straight line IL passing through the control device 40 is shown by a two-dot chain line.

As shown in FIGS. 2 and 3, the battery pack 11 includes a plurality of monitoring devices 30 and one control device 40. The plurality of monitoring devices 30 include a monitoring device 30A, a monitoring device 30B, a monitoring device 30C, a monitoring device 30D, a monitoring device 30E, a monitoring device 30F, a monitoring device 30G, and a monitoring device 30H. The plurality of monitoring devices 30 are arranged side by side in the X direction in an order of the monitoring device 30G, the monitoring device 30E, the monitoring device 30C, the monitoring device 30A, the monitoring device 30B, the monitoring device 30D, the monitoring device 30F, and the monitoring device 30H.

In a plan view, two or more of the plurality of monitoring devices 30 are arranged at different positions on the circumference of a virtual circle centered on the control device 40. The circle is a perfect/true circle. For example, the number of monitoring devices 30 arranged on one circumference may be two or may be three or more. All monitoring devices 30 may be arranged on the circumference of a single circle.

In the present embodiment, two monitoring devices 30 are arranged on one circumference (i.e., on one virtual circle). The virtual circles are concentric circles, and two monitoring devices 30 are arranged on the circumference of each of the virtual circles. One monitoring device 30 is arranged, not on the circumferences of a plurality of circles, but on a circumference of one circle. Specifically, the monitoring devices 30A and 30B are arranged on a circumference of the first circle, which is a circle closest to the control device 40. The monitoring devices 30C and 30D are arranged on a circumference of the second circle, which is one outside, and adjacent to, the first circle. The monitoring devices 30E and 30F are arranged on a circumference of the third circle, which is one outside the second circle. The monitoring devices 30G and 30H are arranged on a circumference of the fourth circle, which is one outside the third circle. The two monitoring devices 30 arranged on a common circle have double symmetry centered on the control device 40.

Further, in a plan view, the two monitoring devices 30 are arranged line-symmetrically with respect to a virtual straight line IL passing through the control device 40. The line-symmetrical arrangement may include not only an arrangement in which the two monitoring devices 30 are completely line-symmetrical with respect to the straight line IL, but also an arrangement in which the two monitoring devices 30 are substantially line-symmetrical. One of the two monitoring devices 30 arranged line-symmetrically corresponds to a first monitoring device, and the other one corresponds to a second monitoring device. The straight line IL extends in a direction orthogonal to an alignment direction of the two monitoring devices 30. Specifically, the straight line IL extends in the Y direction. The monitoring device 30A and the monitoring device 30B are arranged in line symmetry with respect to the straight line IL. The monitoring device 30C and the monitoring device 30D are arranged in line symmetry with respect to the straight line IL. The monitoring device 30E and the monitoring device 30F are arranged in line symmetry with respect to the straight line IL. The monitoring device 30G and the monitoring device 30H are arranged in line symmetry with respect to the straight line IL. The monitoring devices 30A, 30C, 30E, 30G and the monitoring devices 30B, 30D, 30F, 30H are arranged in line symmetry with respect to the straight line IL. That is, the entire monitoring devices 30 are arranged symmetrically with respect to the straight line IL.

Further, in a plan view, the control device 40 is arranged at a midpoint of the two monitoring devices 30. The midpoint may be defined as not only a state in which the distances between the control device 40 and each of the monitoring devices 30 are exactly the same, but also a state in which the distances are almost the same. One of the two monitoring devices 30 corresponds to the third monitoring device, and the other one corresponds to the fourth monitoring device. Specifically, the control device 40 is arranged substantially at the center of the plurality of monitoring devices 30 in the X direction. The control device 40 is arranged at a position between the monitoring device 30A and the monitoring device 30B in the X direction. The control device 40 is arranged at the midpoint of the monitoring devices 30A and 30B in the X direction. Similarly, the control device 40 is arranged at the midpoint of the monitoring devices 30C and 30D in the X direction. The control device 40 is arranged at the midpoint of the monitoring devices 30E and 30F in the X direction. The control device 40 is arranged at the midpoint of the monitoring devices 30G and 30H in the X direction.

<Battery Management System>

Figure 4:
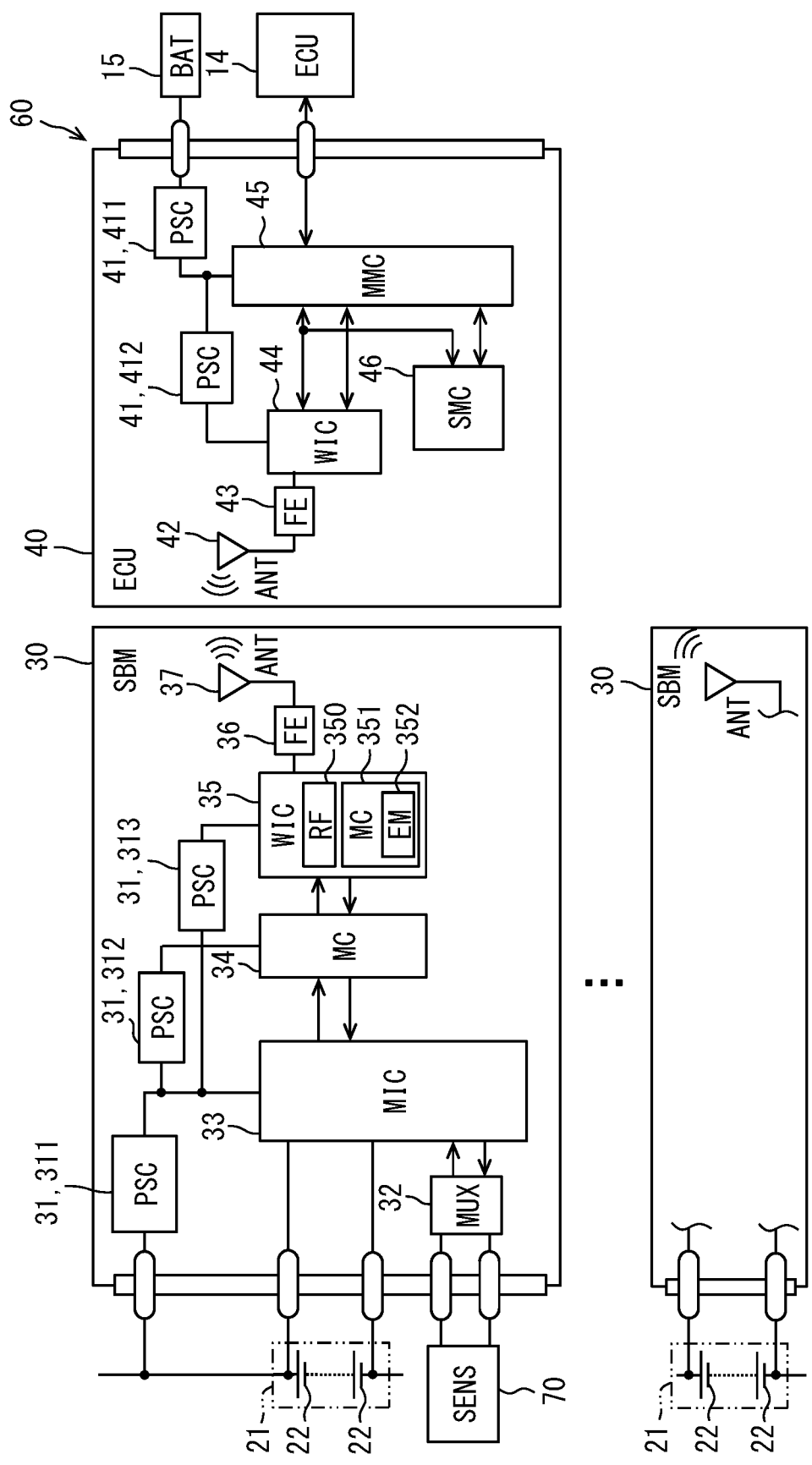
FIG. 4 is a block diagram showing a configuration of a battery management system.

Next, a schematic configuration of the battery management system is described with reference to FIG. 4. FIG. 4 is a block diagram showing the configuration of the battery management system.

As shown in FIG. 4, the battery management system 60 includes a plurality of management devices (SBM) 30 and a control device (ECU) 40. The control device 40 may be referred to as a battery ECU or BMU. BMU is an abbreviation for Battery Management Unit. The battery management system 60 is a system that manages batteries by using wireless communication. In the battery management system 60, wireless communication is performed between one control device 40 and a plurality of monitoring devices 30.

<Monitoring Device>

First, the monitoring device 30 is described. Since the configurations of the monitoring devices 30 are almost the same among all devices 30, the common configurations are described below. The monitoring device 30 includes a power supply circuit (PSC) 31, a multiplexer (MUX) 32, a monitoring IC (MIC) 33, a microcomputer (MC) 34, a wireless IC (WIC) 35, and a front-end circuit (FE) 36, and an antenna (ANT) 37. Communication between those elements in the monitoring device 30 is performed by wire.

The power supply circuit 31 uses the voltage supplied from the battery stack 21 to generate an operating power for operating other circuit elements included in the monitoring device 30. In the present embodiment, the power supply circuit 31 includes power supply circuits 311, 312, 313. The power supply circuit 311 generates a predetermined voltage using the voltage supplied from the battery stack 21 and supplies it to the monitoring IC 33. The power supply circuit 312 generates a predetermined voltage using the voltage generated by the power supply circuit 311 and supplies it to a microcomputer 34. The power supply circuit 313 generates a predetermined voltage using the voltage generated by the power supply circuit 311 and supplies it to the wireless IC 35.

The multiplexer 32 is a selection circuit that inputs detection signals of a plurality of sensors 70 included in the battery pack 11 and outputs them as one signal. The multiplexer 32 selects (i.e., switches) an input according to the selection signal from the monitoring IC 33 and outputs it as one signal. The sensor 70 includes a sensor that detects a physical quantity of each of the battery cells 22, a sensor for determining/identifying which of many battery cells 22 is currently involved, and the like. Physical quantity detection sensors include, for example, voltage sensors, temperature sensors, current sensors, and the like.

The monitoring IC 33 senses (i.e., acquires) battery information such as cell voltage, cell temperature, and cell determination through the multiplexer 32, and transmits the battery information to the microcomputer 34. The monitoring IC 33 may sometimes be referred to as a cell monitoring circuit (CSC). CSC is an abbreviation for Cell Supervising Circuit. The monitoring IC 33 may have a function of (i) performing a failure diagnosis of a circuit portion of the monitoring device 30 (including the IC 33 itself) and (ii) transmitting a diagnosis result together with battery information as monitoring data. When the monitoring IC 33 receives data requesting to acquire the battery information transmitted from the microcomputer 34, the monitoring IC 33 senses (i.e., picks up) the battery information through the multiplexer 32, and transmits the monitoring data including at least the battery information to the microcomputer 34. The monitoring IC 33 corresponds to a monitoring unit.

The microcomputer 34 is a microcomputer provided with a CPU as a processor, ROMs and RAMs as memories, input/output interfaces, and a bus for connecting them. The CPU constructs a plurality of functional units by executing various programs stored in the ROM while using the temporary storage function of the RAM. ROM is an abbreviation for Read Only Memory. RAM is abbreviation for Random Access Memory.

The microcomputer 34 controls the schedule of sensing and self-diagnosis by the monitoring IC 33. The microcomputer 34 receives the monitoring data transmitted from the monitoring IC 33 and transmits it to the wireless IC 35. The microcomputer 34 transmits data requesting acquisition of the battery information to the monitoring IC 33. As an example, when the microcomputer 34 of the present embodiment receives the data requesting the acquisition of the battery information transmitted from the wireless IC 35, the microcomputer 34 transmits the data requesting the acquisition of the battery information to the monitoring IC 33.

The wireless IC 35 includes an RF circuit (RF) 350 and a microcomputer (MC) 351 for transmitting and receiving data wirelessly. The wireless IC 35 has a transmission function of modulating the transmission data and oscillating at the frequency of the RF signal. The wireless IC 35 has a reception function for demodulating received data. RF is an abbreviation for Radio Frequency.

The wireless IC 35 modulates the data including the battery information transmitted from the microcomputer 34 and transmits it to the control device 40 via the front-end circuit 36 and the antenna 37. The wireless IC 35 adds data necessary for wireless communication such as communication control information to transmission data including the battery information, and transmits the data. The data required for wireless communication includes, for example, an identifier (ID) and an error detection code. The wireless IC 35 controls the data size, communication format, schedule, error detection, etc. of the communication between the SBM 30 and the control device 40.

The wireless IC 35 receives the data transmitted from the control device 40 via the antenna 37 and the front-end circuit 36, and demodulates the data. When the wireless IC 35 receives, for example, data including a battery information acquisition and transmission request, the wireless IC 35 acquires the monitoring data including the battery information through the monitoring IC 33 and transmits the monitoring data to the control device 40 as a response to the request. The wireless IC 35 corresponds to a wireless circuit unit.

The wireless IC 35 has an event management unit (EM) 352. The event management unit 352 manages a generation cycle of an advertising event for the wireless IC 35 to perform an advertising operation. The event management unit 352 is one of the functional units constructed by the CPU executing various programs stored in the ROM while using the temporary storage function of the RAM in the microcomputer 351 included in the wireless IC 35, for example. Advertising operation and event management is described later.

The front-end circuit 36 has a matching circuit for impedance matching between the wireless IC 35 and the antenna 37, and a filter circuit for removing unnecessary frequency components.

The antenna 37 converts an RF signal, which is an electric signal, into a radio wave and radiates it into space. The antenna 37 receives radio waves propagating in space and converts them into electric signals.

<Control Device>

Next, the control device 40 is described with reference to FIG. 4. The control device 40 includes a power supply circuit (PSC) 41, an antenna (ANT) 42, a front-end circuit (FE) 43, a wireless IC (WIC) 44, a main microcomputer (MMC) 45, and a sub-microcomputer (SMC) 46. Communication between each of those elements in the control device 40 is performed by wire.

The power supply circuit 41 uses a voltage supplied from the battery (BAT) 15 to generate an operating power for operating other circuit elements included in the control device 40. The battery 15 is a DC voltage source mounted on the vehicle 10 and different from the battery pack 11. The battery 15 may sometimes be referred to as an auxiliary battery because it supplies electric power to auxiliary equipment of the vehicle 10. In the present embodiment, the power supply circuit 41 includes power supply circuits 411 and 412. The power supply circuit 411 generates a predetermined voltage using a voltage supplied from the battery 15, and supplies the voltage to the main microcomputer 45 and the sub-microcomputer 46. For the sake of simplification of the drawing, the electrical connection between the power supply circuit 411 and the sub-microcomputer 46 is omitted. The power supply circuit 412 generates a predetermined voltage using a voltage generated by the power supply circuit 411 and supplies it to the wireless IC 44.

The antenna 42 converts an RF signal, which is an electric signal, into a radio wave and radiates it into space. The antenna 42 receives radio waves propagating in space and converts them into electric signals.

The front-end circuit 43 includes a matching circuit for impedance matching between the wireless IC 44 and the antenna 42, and a filter circuit for removing unnecessary frequency components.

The wireless IC 44 has an RF circuit and a microcomputer for wirelessly transmitting and receiving data. Like the wireless IC 35, the wireless IC 44 has a transmission function and a reception function. The wireless IC 44 receives the data transmitted from the monitoring device 30 via the antenna 42 and the front-end circuit 43, and demodulates the data. Then, the monitoring data including the battery information is transmitted to the main microcomputer 45. The wireless IC 44 receives the data transmitted from the main microcomputer 45, modulates it, and transmits it to the monitoring device 30 via the front-end circuit 43 and the antenna 42. The wireless IC 44 adds data necessary for wireless communication such as communication control information to the transmission data and transmits the data. The data required for wireless communication includes, for example, an identifier (ID) and an error detection code. The wireless IC 44 controls the data size, communication format, schedule, error detection, and the like of communication between the monitoring device 30 and the control device 40.

The main microcomputer 45 is a microcomputer provided with a CPU, a ROM, a RAM, an input/output interface, a bus connecting them, and the like. The ROM stores various programs executed by the CPU. The main microcomputer 45 generates a command requesting the monitoring device 30 to process the monitoring data including the battery information, and transmits the transmission data including the command to the wireless IC 44. The main microcomputer 45 of the present embodiment generates a command requesting acquisition and transmission of the monitoring data including the battery information. The request herein may also be referred to as instruction.

The main microcomputer 45 receives the monitoring data including the battery information transmitted from the wireless IC 44, and performs a predetermined process based on the monitoring data. For example, the main microcomputer 45 performs a process of transmitting the acquired battery information to the ECU 14. The main microcomputer 45 may calculate the SOC and/or SOH based on the battery information, and may transmit the battery information including the calculated SOC and SOH to the ECU 14. The main microcomputer 45 may perform an equalization process for equalizing the voltage of each of the battery cells 22 based on the battery information. The main microcomputer 45 may acquire an IG signal of the vehicle 10 and perform the above-described processing according to a drive state of the vehicle 10. The main microcomputer 45 may perform a process of detecting an abnormality in the battery cell 22 based on the battery information, or may transmit abnormality detection information to the ECU 14.

The sub-microcomputer 46 is a microcomputer provided with a CPU, ROM, RAM, an input/output interface, a bus connecting these, and the like. The ROM stores various programs executed by the CPU. The sub-microcomputer 46 performs a monitoring process for monitoring components/data in the control device 40. For example, the sub-microcomputer 46 may monitor the data exchanged between the wireless IC 44 and the main microcomputer 45. The sub-microcomputer 46 may monitor a state of the main microcomputer 45. The sub-microcomputer 46 may monitor a state of the wireless IC 44.

<Wireless Communication>

Figure 5:
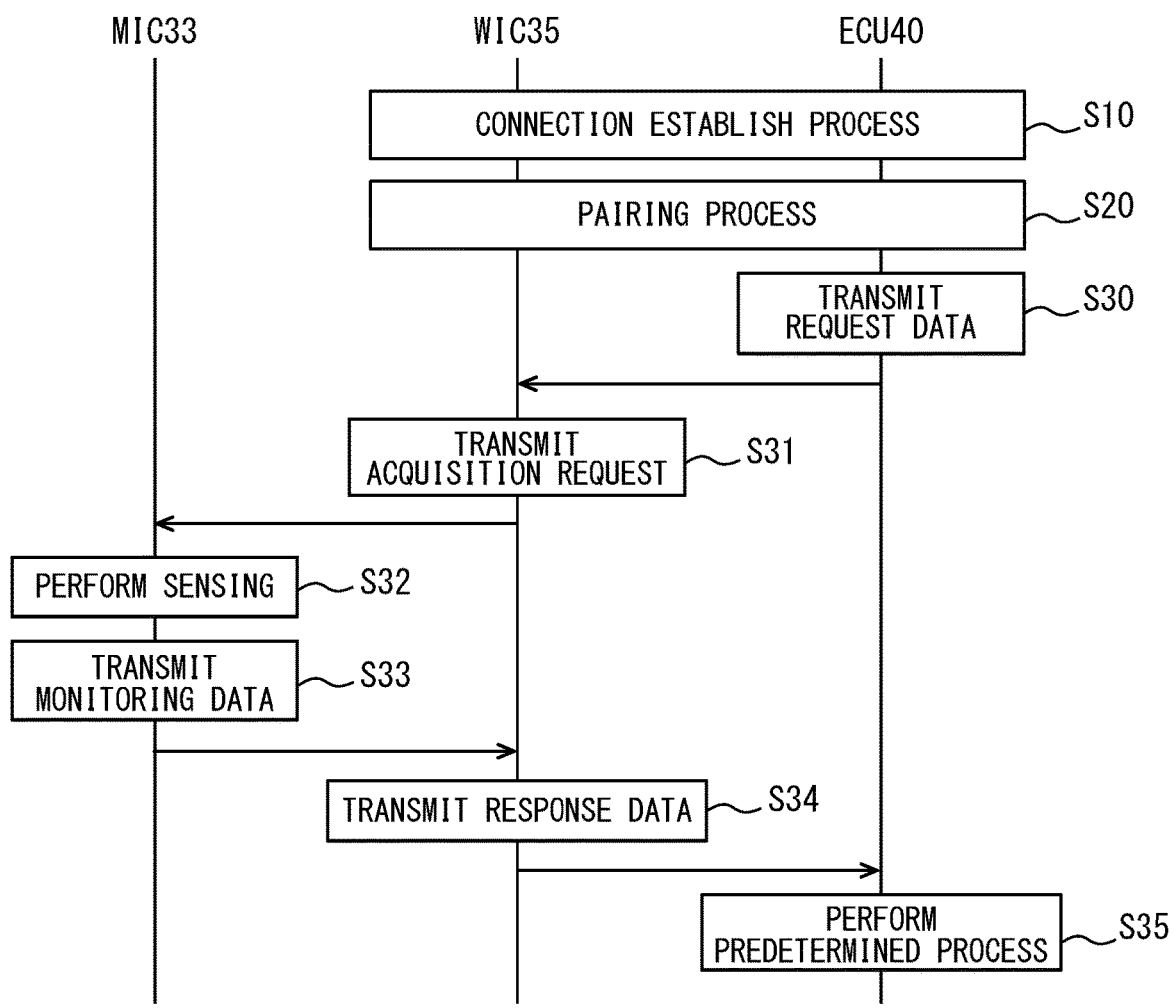
FIG. 5 is a diagram showing an example of a communication sequence between a monitoring device and a control device.

Next, wireless communication between the monitoring device 30 and the control device 40 is described with reference to FIG. 5. FIG. 5 is a diagram showing an example of a communication sequence between the monitoring device 30 and the control device 40. FIG. 5 describes wireless communication between one of the monitoring devices 30 and the control device 40. In FIG. 5, the monitoring IC 33 is shown as MIC33, the wireless IC35 is shown as WIC35, and the control device 40 is shown as ECU40.

As shown in FIG. 5, the wireless IC 35 and the control device 40 of the monitoring device 30 perform a wireless communication connection establish process (step S10). The connection establish process is described later.

When the connection is established, the wireless IC 35 and the control device 40 then perform a pairing process (step S20). Specifically, for encrypted communication, exchange of unique information, that is, pairing is performed. When the pair information is held between the wireless IC 35 and the control device 40, that is, in a bonded state, the pairing process ends.

When the pairing process is complete, the wireless circuit unit 35 and the control device 40 perform data communication. As shown in FIG. 5, the control device 40 transmits request data to the monitoring device 30 (step S30), i.e., transmits transmission data including an acquisition request and a transmission request of the monitoring data including the battery information.

When the wireless IC 35 of the monitoring device 30 receives the request data, the wireless IC 35 transmits an acquisition request for acquiring the monitoring data including the battery information to the monitoring IC 33 (step S31). In the present embodiment, the wireless IC 35 transmits an acquisition request to the monitoring IC 33 via the microcomputer 34.

Upon receiving an acquisition request, the monitoring IC 33 performs sensing (step S32). The monitoring IC 33 performs sensing and acquires battery information of each of the battery cells 22 through the multiplexer 32. In addition, the monitoring IC 33 performs a circuit failure diagnosis.

Next, the monitoring IC 33 transmits the monitoring data including the battery information to the wireless IC 35 (step S33). In the present embodiment, the monitoring data including the failure diagnosis result is transmitted together with the battery information. The monitoring IC 33 transmits data to the wireless IC 35 via the microcomputer 34.

When the wireless IC 35 receives the monitoring data acquired by the monitoring IC 33, the wireless IC 35 transmits the transmission data including the monitoring data, that is, a response data, to the control device 40 (step S34).

When the control device 40 receives the response data, the control device 40 performs a predetermined process based on the monitoring data (step S35). Note that the control device 40 performing a request process may be referred to as a master, and the monitoring device 30 performing a response process may be referred to as a slave.

The processes of steps S10 to S35 described above are performed between each of the monitoring devices 30 and the control device 40. The battery management system 60 initially performs the processes of steps S10 and S20, for example. After the processes of steps S10 and S20 are performed, a data communication process, that is, the processes of steps S30 to S35 are cyclically performed.

<Connection Establish Process>

Figure 6:
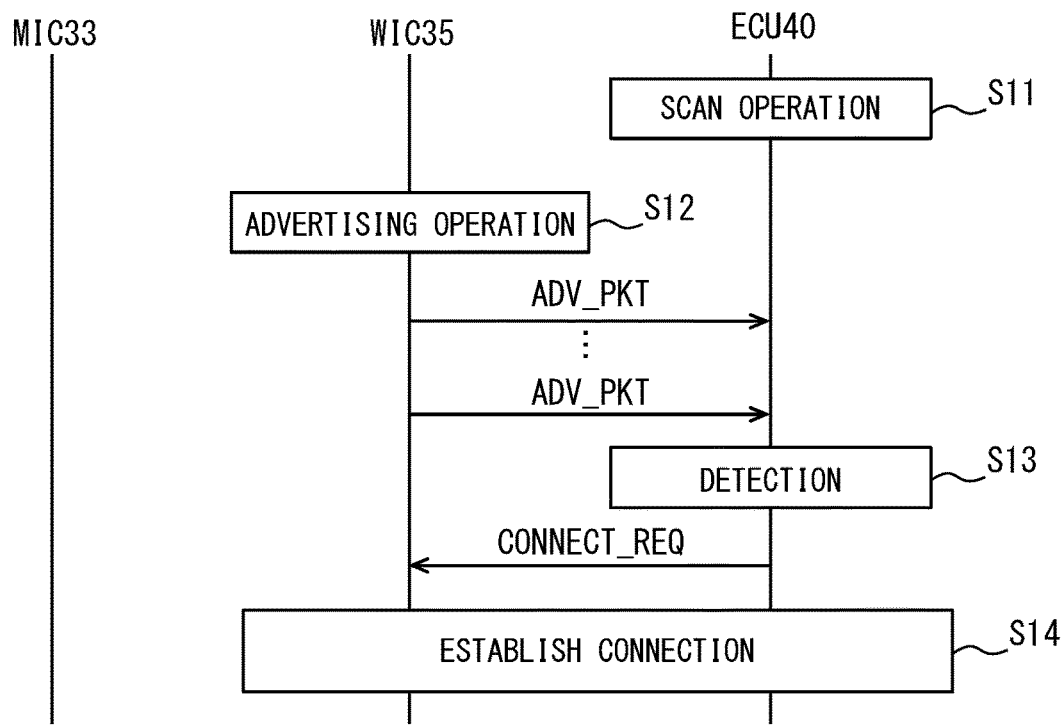
FIG. 6 is a diagram showing an example of a communication sequence up to the establishment of a connection.

Next, the process of step S10 described above, that is, the connection establish process is described with reference to FIG. 6. FIG. 6 is a diagram showing an example of a communication sequence up to the establishment of a connection. FIG. 6 corresponds to FIG. 5.

Each of the monitoring devices 30 and the control device 40 performs the processes of steps S10 and S20 at the time of start-up. Start-up means, for example, a time when operating power is supplied. In a configuration in which operating power is constantly supplied from the battery stack 21 and the battery 15, the vehicle is started after a manufacturing process of the vehicle 10 or after a replacement of parts at a repair shop. Start-up may also be a time of when a start-up signal such as an IG signal is supplied. For example, when the IG signal is switched from off to on by the user's operation, it is a start-up. At the time of start-up, the processes of steps S10 and S20 are performed between the control device 40 and all the monitoring devices 30 to which the wireless communication with the control device 40 is established.

As shown in FIG. 6, first, the control device 40 performs a scan operation (step S11), and the wireless IC 35 performs the advertising operation (step S12). The start of the scan operation may be earlier than the start of the advertising operation, or may be approximately at the same timing. Or, the scan operation may be started later than the start of the advertising operation. The control device 40 that performs the scan operation may sometimes be referred to as a central or as a scanner. The wireless IC 35 that performs the advertising operation may sometimes be referred to as a peripheral or an advertiser.

The wireless IC 35 performs an advertising operation in order to convey its existence to the control device 40. The event management unit 352 of the wireless IC 35 cyclically generates an advertising event. The wireless IC 35 transmits an advertisement packet (ADV_PKT) for each advertising event. That is, the wireless IC 35 cyclically performs the advertising operation. The advertisement packet includes ID information of itself and the ECU 14 and the like. At start-up, the wireless ICs 35 of the plurality of monitoring devices 30 transmit advertisement packets to the control device 40. Advertisement packets may sometimes be referred to as advertisement frames, advertising data, and the like.

When the control device 40 detects one advertisement packet, that is, one wireless IC 35 by the scan operation, the control device 40 transmits a connection request (CONNECT_RQ) to the detected wireless IC 35 (step S13).

Then, when the wireless IC 35 receives a connection request, a connection is established between one monitoring device 30 and the control device 40 (step S14). The wireless IC 35 of the monitoring device 30 for which the connection has been established stops the transmission of the advertisement packet. The control device 40 continues the scan operation until a connection is established with the wireless ICs 35 of all the monitoring devices 30. The monitoring device 30 cyclically performs an advertising operation until a connection is established with the control device 40.

<Advertising Event>

Figure 7:
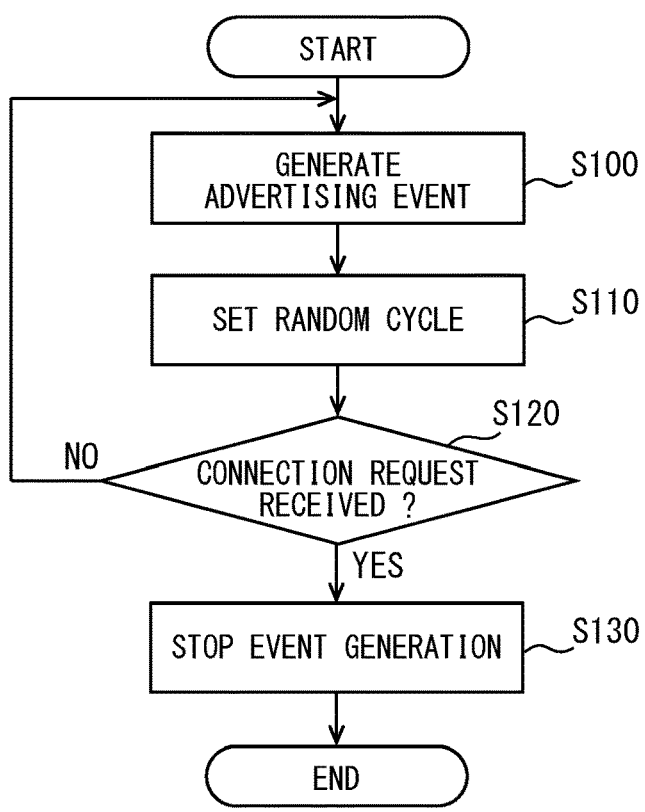
FIG. 7 is a flowchart showing an advertisement process.

Next, the advertising event is described with reference to FIGS. 7 and 8. FIG. 7 is a flowchart showing an example of an event management process performed by the event management unit 352 of the wireless IC 35. The event management unit 352 performs the following processes at the time of the connection establish process (step S10).

As shown in FIG. 7, the event management unit 352 of the wireless IC 35 generates an advertising event (step S100). The event management unit 352 generates a first advertising event with reference to and after the start-up of the wireless IC 35. In the present embodiment, a generation timing of the first advertising event is substantially the same for the plurality of the wireless ICs 35. The wireless IC 35 transmits an advertisement packet in response to an advertising event.

Next, the event management unit 352 randomly sets a cycle (step S110). That is, the event management unit 352 sets a random duration of time as a "cycle" of the advertising event. The event management unit 352 calculates and sets the cycle by a specific function such as a generator polynomial using a unique value held by the wireless IC 35, for example, an ID or an address that identifies a network interface. The wireless IC 35 uses input information from elements of the monitoring device 30 other than the wireless IC 35, for example, monitoring information acquired by the monitoring IC 33 and commands (instructions) from the microcomputer 34, instead of using the above-mentioned unique values, to calculate and set a cycle by a specific function such as a generator polynomial. That is, the event management unit 352 calculates and sets a cycle by a specific function such as a generator polynomial using a value unique to the monitoring device 30 including the relevant event management unit 352.

In such manner, the event management unit 352 randomly sets a cycle by an operation using a specific function such as a generator polynomial. That is, a random number is set as the cycle. In the present embodiment, as an example, a cycle is randomly set by (i) calculating an amount of delay by a specific function, and (ii) adding such a delay to a predetermined cycle. The predetermined cycle is a value common to the plurality of the monitoring devices 30.

Next, the event management unit 352 determines whether or not a connection request has been received from the control device 40 (step S120). When the event management unit 352 receives a connection request within a cycle set in step S110, the event management unit 352 stops the generation of the advertising event (step S130), and ends a series of processes.

On the other hand, if any connection request is not received within the cycle set in step S110, the event management unit 352 re-performs the processes after step S100 when the cycle set in step S110 elapses. That is, when the cycle set in step S110 elapses, the event management unit 352 newly generates an advertising event.

In the above-mentioned event management process, the processes of steps S120 and S130 may be performed as common processes with a continuation determination and a stop process of the advertising operation by the wireless IC 35. A cycle setting process may be performed before a generation process of the advertising event, or the two processes may be performed in parallel.

Figure 8:
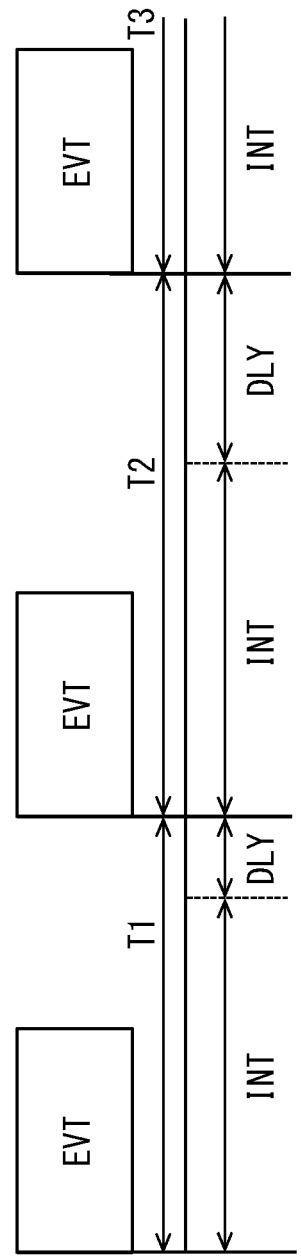
FIG. 8 is a diagram showing an generation cycle of an advertising event.

FIG. 8 is a diagram showing a generation cycle of an advertising event. In FIG. 8, an advertising event is shown as EVT, and a generation cycle of the advertising event is shown as T. A predetermined cycle described above is shown as INT, and a delay amount is shown as DLY.

As described above, the predetermined cycle INT is a value common to the plurality of monitoring devices 30. The delay amount DLY is a random value calculated by the event management unit 352 using a specific function, that is, a random number. In such manner, the event management unit 352 randomly sets the generation cycle T of the advertising event. In an example of FIG. 8, the first cycle T1 and the second cycle T2 are different because the delay amount DLY is different at respective positions.

Summary of First Embodiment

Figure 9:
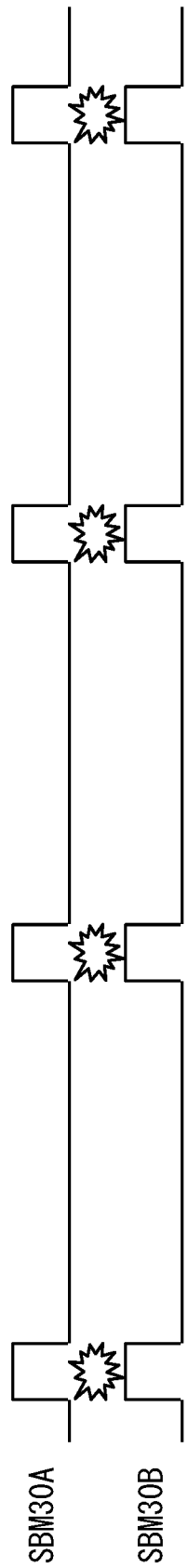
FIG. 9 is a timing chart showing advertising operations of two monitoring devices in a reference example.
Figure 10:
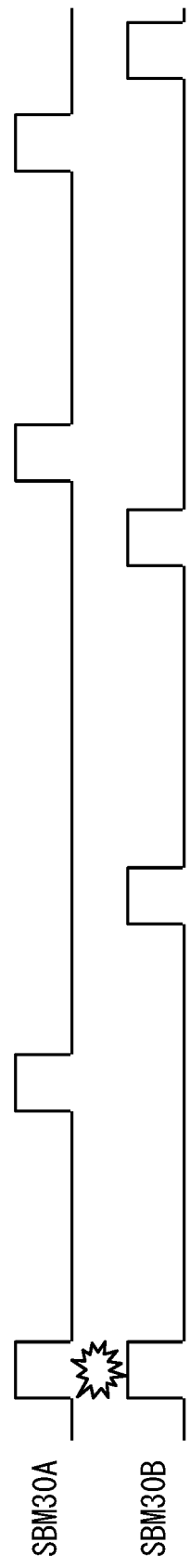
FIG. 10 is a timing chart showing advertising operations of two monitoring devices in the first embodiment.

FIG. 9 is a diagram showing the timing of the advertising operations of the two monitoring devices 30 in a reference example. FIG. 10 is a diagram showing the timing of the advertising operations of the two monitoring devices 30 in the battery management system 60 according to the present embodiment. In FIGS. 9 and 10, the monitoring devices 30A and 30B are illustrated as the two monitoring devices 30. The monitoring device 30A is referred to as SBM30A, and the monitoring device 30B is referred to as SBM30B.

The wireless IC 35 of the monitoring devices 30A and 30B of the reference example does not have the event management unit 352 described above. In each of the wireless ICs 35, the generation timing of the first advertising event after start-up is substantially the same as each other. Each of the wireless ICs 35 generates an advertising event at a common cycle. Therefore, as shown in FIG. 9, the timings of the advertising operations of the monitoring devices 30A and 30B are cyclically (repeatedly) overlapped. Therefore, if the monitoring devices 30A and 30B transmit the advertisement packet at the time of start-up, radio wave interference may occur.

In the present embodiment, the wireless ICs 35 of the monitoring devices 30A and 30B each have an event management unit 352. The event management unit 352 randomly sets the generation cycle of the advertising event. Therefore, as shown in FIG. 10, it is possible to prevent the timings of the advertising operations of the monitoring devices 30A and 30B from overlapping cyclically/repeatedly. Thus, even if the monitoring devices 30A and 30B transmit the advertisement packet at the time of start-up, radio wave interference is less likely to occur as compared with the reference example.

As described above, according to the battery management system 60 according to the present embodiment, the event management unit 352 manages the generation cycle of the advertising event so that the advertising operations are performed at different timings from each other. Specifically, the event management unit 352 randomly sets the generation cycle of the advertising event by a specific function such as a generator polynomial using a value unique to the monitoring device 30 having the event management unit 352. Therefore, even if the plurality of monitoring devices 30 perform the advertising operation at the time of start-up, it is possible to suppress the occurrence of radio wave interference. In the present embodiment, since the cycle of the advertising event changes randomly every time, it is possible to increase the possibility of avoiding external noise and the like. In particular, it is possible to increase the possibility of avoiding cyclic noise. That is, the connection can be reliably established.

The control device 40 and the plurality of monitoring devices 30 constituting the battery management system 60 are housed in the housing 50 of the battery pack 11. The control device 40 and the plurality of monitoring devices 30 are arranged in a closed space (i.e., in a limited narrow/small space). In a closed space, wireless communication between one control device 40 and a plurality of monitoring devices 30, that is, one-to-many wireless communication, is performed. In the present embodiment, each of the plurality of monitoring devices 30 has an event management unit 352. In the plurality of monitoring devices 30, the event management unit 352 randomly sets a generation cycle of the advertising event. Therefore, even if the plurality of monitoring devices 30 perform the advertising operation at the time of start-up, it is possible to suppress the occurrence of radio wave interference. Although the two monitoring devices 30A and 30B are illustrated in FIG. 10, the generation timing of the advertising event (i.e., timing of the advertising operation) may similarly be shifted among other devices 30, i.e., among the devices 30A to 30H.

In the present embodiment, for example, two monitoring devices 30A and 30B are arranged on the circumference of a virtual circle centered on the control device 40. The monitoring devices 30A and 30B arranged in such manner have substantially the same distance to the control device 40 in a plan view. However, each of the monitoring devices 30A and 30B has an event management unit 352. Therefore, even if each of the monitoring devices 30A and 30B performs the advertising operation at the time of start-up, it is possible to suppress the occurrence of radio wave interference.

In the present embodiment, a virtual circle centered on the control device 40 is a concentric circle, and two monitoring devices 30 are arranged on each of the concentric circles. The monitoring devices 30A and 30B are arranged on the circumference of the first circle. The monitoring devices 30C and 30D are arranged on the circumference of the second circle. The monitoring devices 30E and 30F are arranged on the circumference of the third circle. The monitoring devices 30G and 30H are arranged on the circumference of the fourth circle. Therefore, even if each of the monitoring devices 30 arranged on the same circumference performs the advertising operation at the time of start-up, it is possible to suppress the occurrence of radio wave interference.

The number of monitoring devices 30 arranged on the circumference of one circle is not limited to two. Three or more monitoring devices 30 may also be arranged on the circumference of one circle. In the concentric circles, an example is shown in which the number of monitoring devices 30 arranged on the circumference of each circle is equal to each other, but the present disclosure is not limited to such configuration. For example, the number of monitoring devices 30 may be different between the first circle and the second circle. In the present embodiment, an example of concentric circles is shown as a virtual circle, but the present disclosure is not limited to such configuration. Only one circle may be used.

In the present embodiment, for example, two monitoring devices 30A and 30B are arranged line-symmetrically with respect to a virtual straight line IL passing through the control device 40. The monitoring devices 30A and 30B arranged in such manner have substantially the same distance to the control device 40 in a plan view. However, each of the monitoring devices 30A and 30B has an event management unit 352. Therefore, even if each of the monitoring devices 30A and 30B performs the advertising operation at the time of start-up, it is possible to suppress the occurrence of radio wave interference. The same applies to the positional relationship between the monitoring device 30C and the monitoring device 30D, the positional relationship between the monitoring device 30E and the monitoring device 30F, and the positional relationship between the monitoring device 30G and the monitoring device 30H.

In the present embodiment, the control device 40 is arranged at the midpoint of, for example, two monitoring devices 30A and 30B. The monitoring devices 30A and 30B arranged in such manner have substantially the same distance to the control device 40 in a plan view. However, each of the monitoring devices 30A and 30B has an event management unit 352. Therefore, even if each of the monitoring devices 30A and 30B performs the advertising operation at the time of start-up, it is possible to suppress the occurrence of radio wave interference. The same applies to the positional relationship between the monitoring device 30C and the monitoring device 30D, the positional relationship between the monitoring device 30E and the monitoring device 30F, and the positional relationship between the monitoring device 30G and the monitoring device 30H.

In the present embodiment, the event management unit 352 adds a delay amount DLY, which is a random value calculated based on an ID, to a predetermined cycle INT, which is a common value for each of the wireless ICs 35, to set a random generation cycle for an advertising event. However, the method of randomly setting the generation cycle of the advertising event is not limited to the above example. For example, the generation cycle of the advertising event may be randomly set only by the above-mentioned delay amount DLY.

Second Embodiment

The second embodiment is a modification of a preceding embodiment which serves as a basic configuration and may incorporate description of the preceding embodiment. In the preceding embodiment, the generation cycle of the advertising event is set by a random number. Instead of the above, the timing of the first advertising event after start-up may be shifted.

Figure 11:
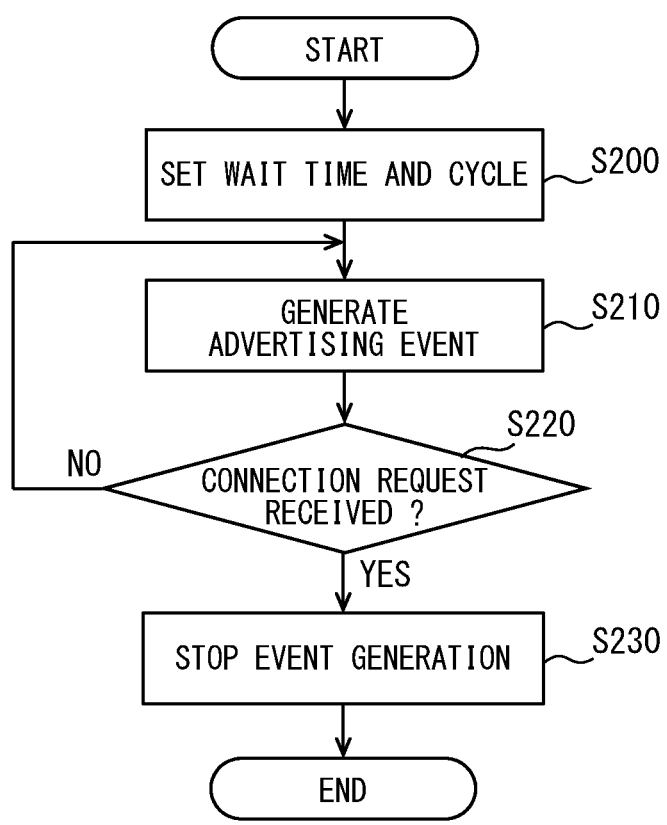
FIG. 11 is a flowchart showing a process performed by the event management unit in the battery management system according to a second embodiment.

FIG. 11 is a flowchart of a process performed by the event management unit 352 during the connection establish process in the battery management system 60 according to the present embodiment.

As shown in FIG. 11, the event management unit 352 of the wireless IC 35 sets a wait time until the first advertising event is generated and the cycle of the advertising event (step S200). The wait time is a time from the reference timing based on the start-up timing of the wireless IC 35 having the event management unit 352 to the generation timing of the first advertising event. The wait time is preset to a value different from each other for each of the wireless ICs 35. The cycle is a fixed value (constant value), i.e., not a variable value as in the preceding embodiment. The reference timing may be the start-up timing, or may be a start-up timing with a predetermined value (i.e., a fixed value) added thereto. The predetermined value is a value common to a plurality of wireless ICs 35. The event management unit 352 reads and sets the wait time and the cycle stored in the memory in advance.

Next, the event management unit 352 generates an advertising event according to the wait time and the cycle set in step S200 (step S210). The event management unit 352 generates the first advertising event after start-up, after a predetermined wait time has elapsed from the reference timing. The event management unit 352 generates the second and subsequent advertising events in the above-mentioned predetermined cycle. The wireless IC 35 transmits an advertisement packet in response to an advertising event.

Next, the event management unit 352 determines whether or not a connection request has been received from the control device 40 (step S220). When the event management unit 352 receives the connection request within the cycle set in step S200, the event management unit 352 stops the generation of the advertising event (step S230) and ends a series of processes.

On the other hand, if the connection request is not received within the cycle set in step S200, the event management unit 352 re-performs the process of step S210 when the cycle set in step S200 elapses. That is, when the cycle set in step S200 elapses, the event management unit 352 newly generates an advertising event.

In the above-mentioned event management process, the processes of steps S220 and S230 may be common processes with the continuation determination and stop processes of the advertising operation by the wireless IC 35. In the battery management system 60, the configuration other than the processing performed by the event management unit 352 is the same as the configuration described in the preceding embodiment. For example, the same applies to the positional relationship between the control device 40 and the plurality of monitoring devices 30.

Summary of Second Embodiment

Figure 12:
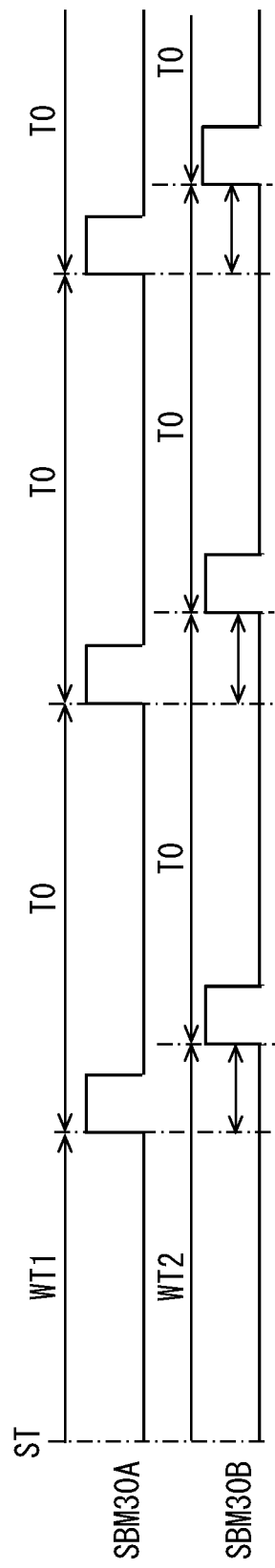
FIG. 12 is a timing chart showing advertising operations of two monitoring devices.

FIG. 12 is a diagram showing the timing of advertising operations of the two monitoring devices 30 in the battery management system 60 according to the present embodiment. In FIG. 12, the monitoring devices 30A and 30B are illustrated as the two monitoring devices 30. Further, the monitoring device 30A is referred to as SBM30A, and the monitoring device 30B is referred to as SBM30B. In FIG. 12, the reference timing is shown as ST, and the wait time from the reference timing ST to the generation timing of the first advertising event after start-up is shown as WT. The generation cycle of the advertising event, that is, the cycle of the advertising operation is indicated as T0.

The start-up timing of the wireless IC 35 of the monitoring device 30A and the start-up timing of the wireless IC 35 of the monitoring device 30B are substantially the same as described above. Therefore, the reference timing STs are also substantially the same to each other. A wait time WT1 of the monitoring device 30A and a wait time WT2 of the monitoring device 30B are different from each other. Due to the difference between the wait times WT1 and WT2, the generation timing of the first advertising event after start-up is deviated among the two devices 30A and 30B. The cycle T0 is a fixed value (i.e., a constant value), and is a value common to the monitoring devices 30A and 30B. Each of the wireless ICs 35 generates an advertising event in a common cycle T0. Due to the difference between the wait times WT1 and WT2, the generation timing of the second and subsequent advertising events is different (i.e., is shifted among the two devices). Therefore, it is possible to prevent the timings of the advertising operations of the monitoring devices 30A and 30B from overlapping cyclically. Even if the monitoring devices 30A and 30B transmit the advertisement packet at the time of start-up, radio wave interference is unlikely to occur.

As described above, according to the battery management system 60 according to the present embodiment, the event management unit 352 manages the generation cycle of the advertising event so that the advertising operations are performed at different timings from each other. Specifically, the generation cycle of the advertising event is set so that the generation timing of the first advertising event is different from each other based on (i.e., with reference to) the start-up of each of the wireless ICs 35. Therefore, even if the plurality of monitoring devices 30 perform the advertising operation at the time of start-up, it is possible to suppress the occurrence of radio wave interference. In the present embodiment, since the cycle itself is fixed, it is easy for the control device 40 to grasp how long (i.e., how many cycles) it is required to complete the connection establishment for the plurality of monitoring devices 30. Thereby, the controllability of the control device 40 can be improved.

Also in the present embodiment, wireless communication between one control device 40 and a plurality of monitoring devices 30, that is, one-to-many wireless communication is performed in a closed space. Each of the plurality of monitoring devices 30 has an event management unit 352. In the plurality of monitoring devices 30, the event management unit 352 sets the generation cycle of the advertising event so that the generation timing of the first advertising event is different from each other. Therefore, even if the plurality of monitoring devices 30 perform the advertising operation at the time of start-up, it is possible to suppress the occurrence of radio wave interference. Although the two monitoring devices 30A and 30B have been illustrated in FIG. 12, similarly, the generation timing of the advertising event, that is, the timing of the advertising operation can be different from each other for the plurality of monitoring devices 30A to 30H.

Third Embodiment

The second embodiment is a modification of a preceding embodiment which serves as a basic configuration and may incorporate description of the preceding embodiment. In the preceding embodiment, the advertising event at start-up has been described. In the present embodiment, an advertising event at the time of re-connection is described.

Figure 13:
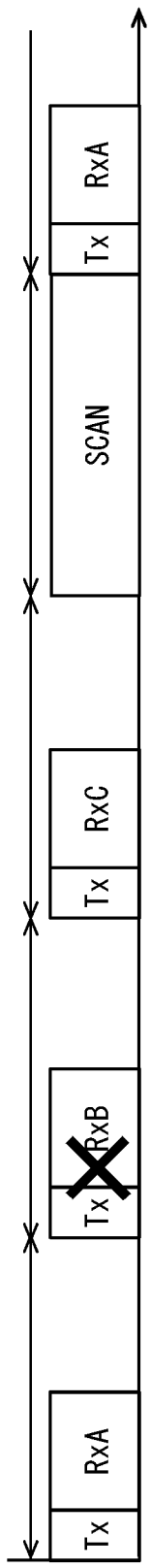
FIG. 13 is a diagram for explaining re-connection.

FIG. 13 is a diagram showing data transmission/reception timing of the control device 40 in order to explain re-connection after disconnection. FIG. 13 shows, as an example, wireless communication with three monitoring devices 30 (30A, 30B, 30C). Tx indicates a transmission timing of the request data transmitted from the control device 40 to the monitoring device 30. Rx indicates a reception timing of the response data transmitted from the monitoring device 30 to the control device 40. An end (i.e., an appended character) of Rx indicates which monitoring device 30 sent the response data. For example, RxA is the response data transmitted from the monitoring device 30A.

When the connection state between the control device 40 and one monitoring device 30 is disconnected, the control device 40 performs re-connection (establishment of connection) with the disconnected monitoring device 30 while continuing communication with the remaining monitoring devices 30 for which the connection has been established. For example, disconnection occurs due to deterioration of the communication environment. In the example shown in FIG. 13, the connection between the control device 40 and the monitoring device 30B is disconnected. The control device 40 continues to connect with the remaining monitoring devices 30. Specifically, data is transmitted and received to and from the monitoring device 30C. Then, when the communication with the three monitoring devices 30 is complete (either successfully or unsuccessfully), the control device 40 performs a scan operation in order to reconnect with the monitoring device 30B. Further, the monitoring device 30B performs the advertising operation. In such manner, the connection between the control device 40 and the monitoring device 30B is reestablished. When the re-connection process is complete, data transmission/reception with the three monitoring devices 30 is performed in a predetermined order.

Figure 14:
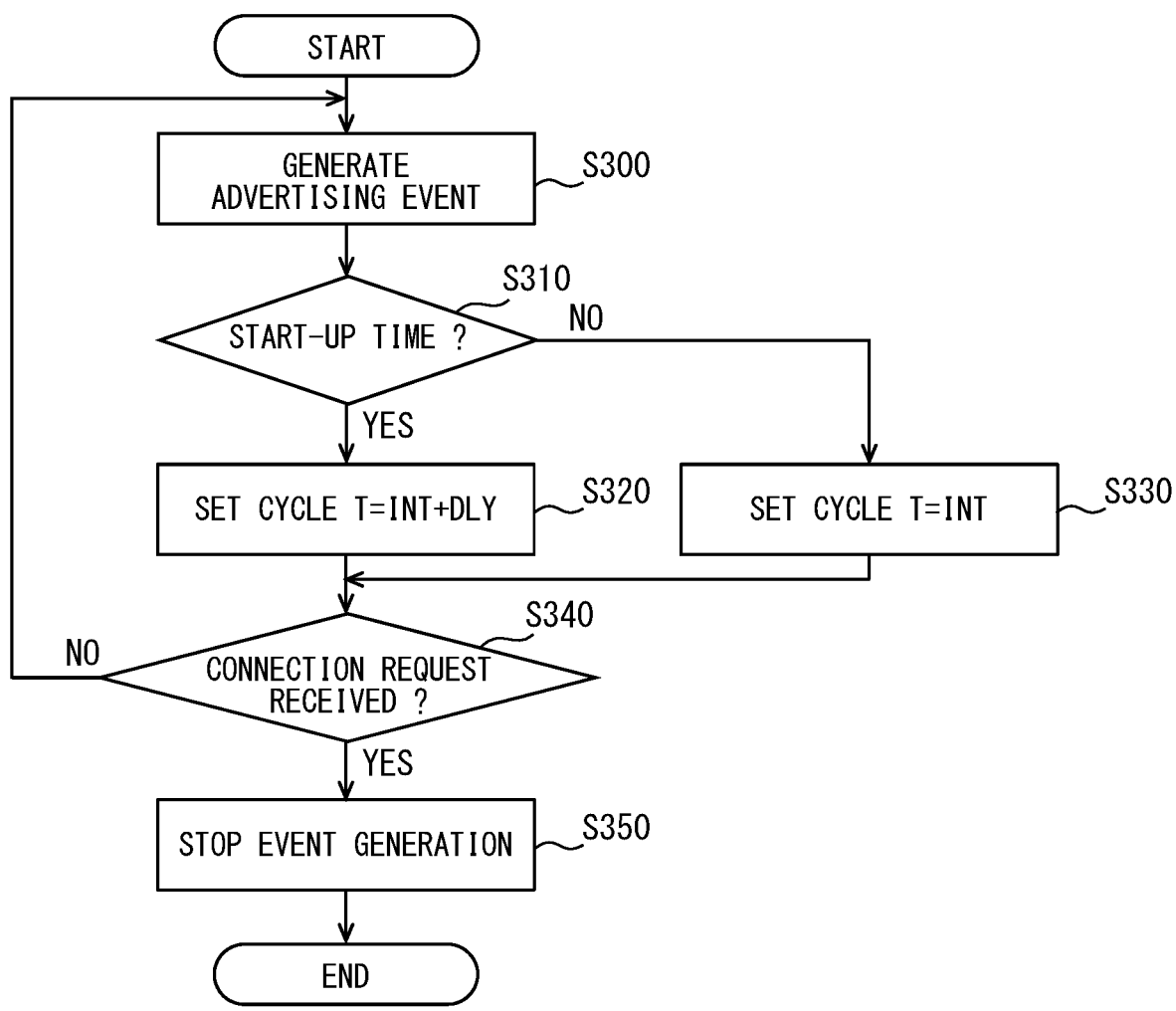
FIG. 14 is a flowchart showing a process performed by an event management unit in the battery management system according to a third embodiment.

FIG. 14 is a flowchart of a process performed by the event management unit 352 during the connection establish process in the battery management system 60 according to the present embodiment.

First, the event management unit 352 generates an advertising event as in the process of step S100 (step S300). Next, the event management unit 352 determines whether or not it is at the time of start-up (step S310). That is, it is determined whether the connection is established at the time of start-up or at the time of re-connection.

When it is determined that it is the connection at the start-up time, the event management unit 352 randomly sets the generation cycle of the advertising event as in the process of step S120 (step S320). For example, as in the preceding embodiment, the generation cycle is randomly set by adding a delay amount (DLY), which is a random number calculated by a specific function, to a predetermined cycle (INT).

On the other hand, if it is determined that it is not at the start-up time, that is, at the time of re-connection, the event management unit 352 sets a cycle shorter than the cycle set in step S320 (step S330). For example, a predetermined cycle (INT) is set as the generation cycle. Since the delay amount is not added, it is shorter than the cycle set in step S320.

Next, the event management unit 352 determines whether or not a connection request has been received from the control device 40, as in the process of step S120 (step S340).

When the event management unit 352 receives the connection request within the cycle set in step S320 or step S330, the event management unit 352 stops the generation of the advertising event (step S350) and ends a series of processes as in step S130.

On the other hand, if the connection request is not received within the cycle set in step S320 or step S330, the event management unit 352 re-performs the processes after step S300 when the set cycle elapses. That is, when the set cycle elapses, the event management unit 352 newly generates an advertising event.

In the above-mentioned event management process, the processes of steps S340 and S350 may be common processes with the continuation determination and stop processes of the advertising operation by the wireless IC 35. The processes of steps S310, S320, and S330, that is, a start-up determination process and the cycle setting process, may be performed before the advertising event generation process (step S300), or the two processes may be performed in parallel. In the battery management system 60, the configuration other than the processing performed by the event management unit 352 is the same as the configuration described in the preceding embodiment.

Summary of Third Embodiment

When the connection between one of the plurality of monitoring devices 30 and the control device 40 is disconnected, wireless communication between the remaining monitoring device 30 and the control device 40 is continued (i.e., maintained). That is, only one disconnected monitoring device 30 performs the advertising operation in order to reestablish the connection. Therefore, the advertising operations of the plurality of wireless ICs 35 do not overlap, thereby radio wave interference does not occur. Further, a frequency band used for transmitting and receiving request data and response data is different from a frequency band used for advertising operation and scan operation. Therefore, even if the wireless IC 35 of the disconnected monitoring device 30 performs the advertising operation to establish the connection again, it is unlikely or does not interfere with other radio waves during data communication.

Figure 15:
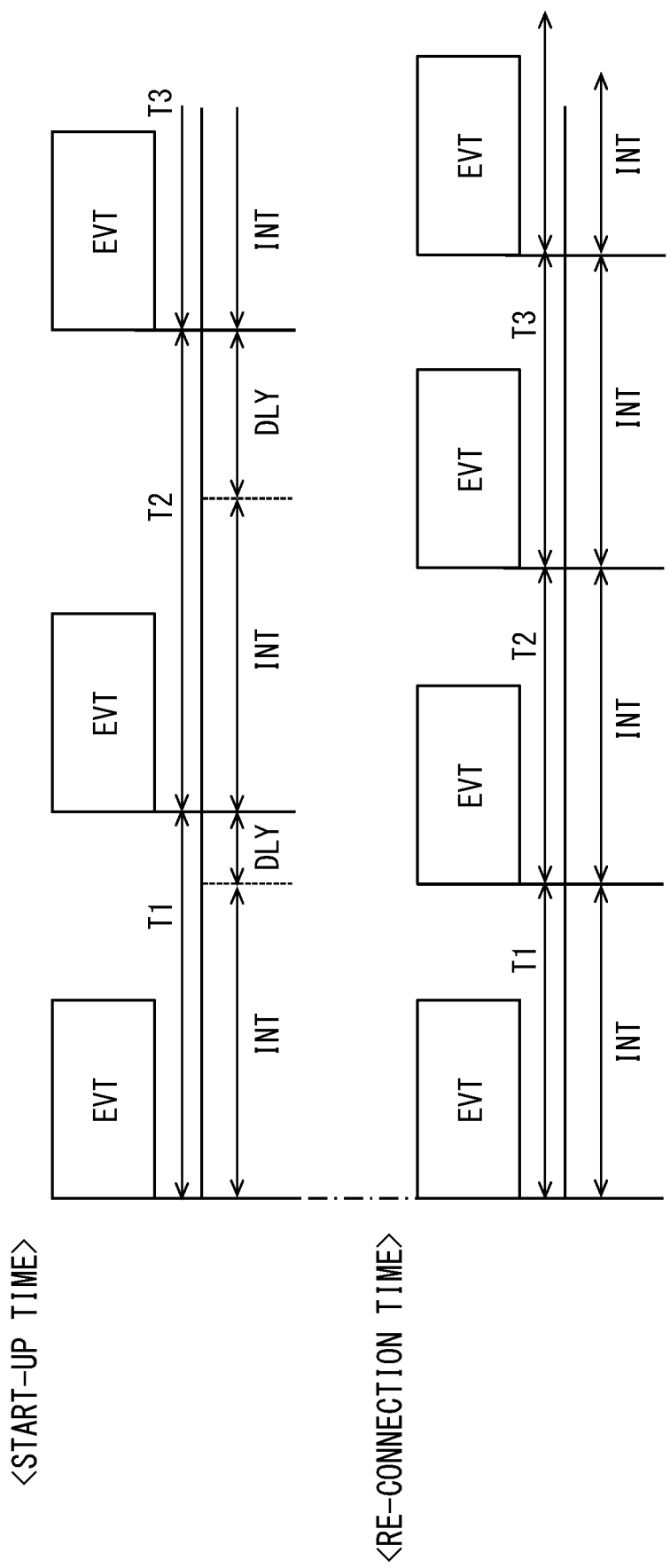
FIG. 15 is another diagram showing an generation cycle of the advertising event.

In the present embodiment, the event management unit 352 of the monitoring device 30 that establishes the connection at the time of re-connection after the wireless communication connection between one of the plurality of monitoring devices 30 and the control device 40 is disconnected sets the event generation cycle that is shorter than the cycle of the start-up. As shown in FIG. 15, at the time of start-up, the generation cycle is randomly set by adding a delay amount (DLY), which is a random number calculated by a specific function, to a predetermined cycle (INT). At the time of re-connection, a predetermined cycle (INT) is set as the generation cycle. Therefore, the generation cycle of the advertising event is shorter at the time of re-connection than at the time of start-up. That is, the advertising event occurs at the time of re-connection earlier than at the time of start-up. During a predetermined cycle, more advertising events occur, and thus more advertising operations are performed.

As described above, at the time of re-connection, the possibility of radio wave interference is low even if the advertising operation is performed, thereby the generation cycle of the advertising event can be shortened and the re-connection time can be shortened as compared with the time of start-up. In such manner, it is possible to suppress a delay in another monitoring device 30 that continues data communication, for example, a delay in acquiring the battery information (i.e., the monitoring data) by the control device 40. According to the present embodiment, it is possible to shorten the re-connection time while suppressing radio wave interference at the time of start-up.

The generation cycle of the advertising event is not limited to the above example. For example, in the above example, the cycle at the time of re-connection may be shorter than the predetermined cycle (INT). Further, in the configuration shown in the second embodiment (see FIGS. 11 and 12), the generation cycle at the time of re-connection may be shorter than the generation cycle T0 at the time of start-up. Further, the wait time may be shorter than the wait time WT at the start-up.

Fourth Embodiment

The present embodiment is a modification of the preceding embodiment(s) which serve(s) as a basic configuration and may incorporate description of the preceding embodiment(s). Although not specifically mentioned in the preceding embodiment(s), the stop of the advertising operation or the scan operation may be determined based on identification information. That is, a target for establishing the connection may be limited.

Figure 16:
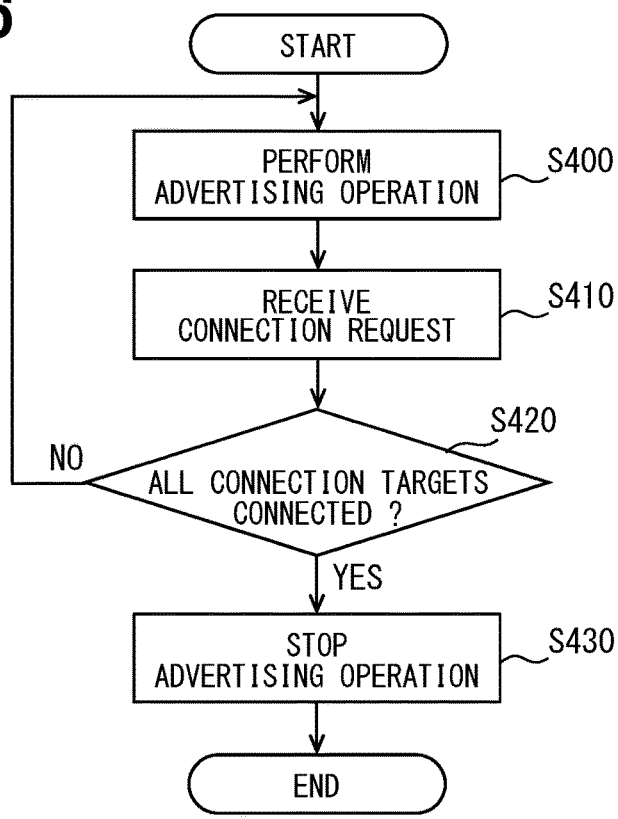
FIG. 16 is a flowchart showing an advertisement process performed by the monitoring device.
Figure 17:
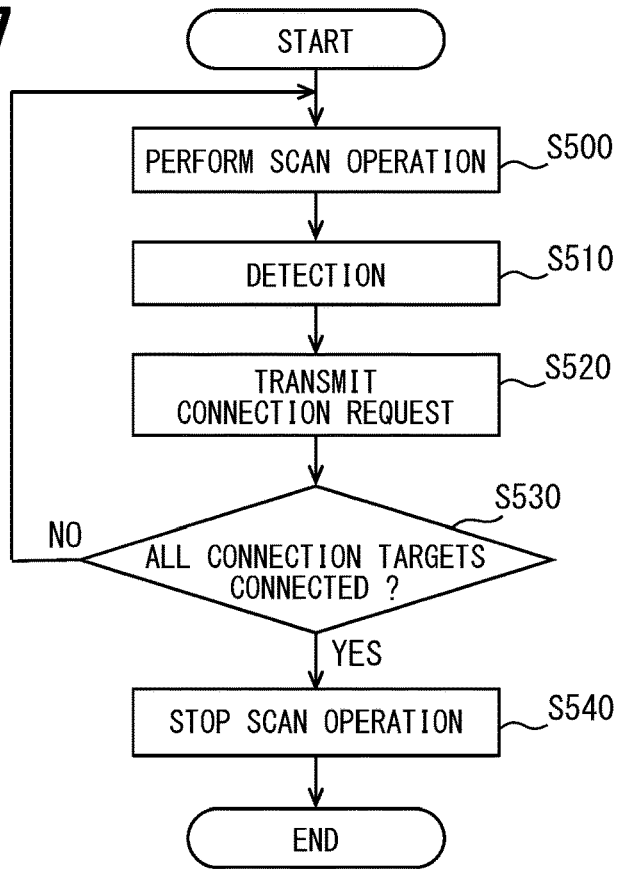
FIG. 17 is a flowchart showing a scanning process performed by the control device.

FIG. 16 is a flowchart showing an advertisement process performed by each of the wireless ICs 35 at the time of establishing a connection in the battery management system 60 according to the present embodiment. The advertisement process is a process excluding the event management process performed by the event management unit 352 among the processes performed by the wireless IC 35 when the connection is established. FIG. 17 is a flowchart showing a scan process performed by the control device 40 when the connection is established in the battery management system 60 according to the present embodiment.

The control device 40 has, in advance, identification information of each of the plurality of monitoring devices 30 (i.e., a wireless IC 35) to be connected. Each of the wireless ICs 35 of the plurality of monitoring devices 30 has identification information of the control device 40 (i.e., a wireless IC 44) to be connected. The identification information is, for example, an ID assigned to each device.

As shown in FIG. 16, the wireless IC 35 of the monitoring device 30 first performs an advertising operation (step S400). The wireless IC 35 performs the advertising operation according to the advertising event generated by the event management unit 352. The wireless IC 35 cyclically performs an advertising operation.

When the wireless IC 35 receives the connection request (step S410), it determines whether or not it has connected to all the connection targets, that is, whether or not it has reached a predetermined number of connections (step S420). The wireless IC 35 determines whether or not all the connection targets are connected by collating the identification information of the connection target held by the wireless IC 35 with the identification information included in connection request data.

When there are a plurality of connection targets, if the connections with all the connection targets are not complete, the process returns to the process of step S400. When the connections with all the connection targets are complete, the process proceeds to step S430. For example, when the connection target is one control device 40, when the connection request is received in step S410, the subsequent determination process in step S420 is also YES.

When the connection with all the connection targets is complete, the wireless IC 35 stops the advertising operation (step S430), and ends a series of processes.

As shown in FIG. 17, the control device 40 (i.e., a wireless IC 44) first performs a scan operation (step S500).

When the control device 40 receives the advertisement packet, that is, detects a connection target (step S510), the control device 40 transmits a connection request to the detected connection target (step S520). Further, the control device 40 determines whether or not all the connection targets are connected, that is, whether or not a predetermined number of connections has been reached (step S530). The control device 40 determines whether or not all the connection targets are connected by collating the identification information of the connection target held by the control device 40 with the identification information included in the advertisement packet. If the connection with all the connection targets is not complete, the process returns to the process of step S400.

When the connection with all the connection targets is complete, the control device 40 stops the scan operation (step S540), and ends a series of processes.

After the connection is established, when the communication environment deteriorates due to noise or the like during data communication and data cannot be transmitted/received for a certain period of time, the wireless IC 35 of the monitoring device 30 performs the process shown in FIG. 16 again, and the control device 40 performs the process shown in FIG. 17 again. For example, the wireless IC 35 re-performs the advertising operation described above when the monitoring data including the battery information cannot be transmitted for a certain period of time. When the control device 40 cannot receive the monitoring data including the battery information for a certain period of time, the control device 40 re-performs the advertising operation described above.

In the battery management system 60, the configuration is the same as that described in the preceding embodiment except for the advertisement process performed by the monitoring device 30 and the scan process performed by the control device 40.

Summary of Fourth Embodiment

As described above, in the present embodiment, the monitoring device 30 has, in advance, the identification information of the control device 40 to be connected, and the advertising operation is stopped when connection is established to all the control devices 40 having the identification information, that is, is established to all the connection targets. In such manner, erroneous connection can be suppressed. For example, it is possible to suppress the establishment of a connection with the control device of another vehicle (for example, the same vehicle type) existing around the vehicle 10.

Similarly, the control device 40 has, in advance, the identification information of the monitoring device 30 to be connected, and when the connection with all the monitoring devices 30 having the identification information, that is, all the connection targets, is established, the scan operation is stopped. In such manner, erroneous connection can be suppressed. For example, it is possible to suppress the establishment of a connection with a monitoring device of another vehicle (for example, the same vehicle type) existing around the vehicle 10.

The configurations described in the present embodiment can be combined with any of the configurations described in the preceding embodiments.

Other Embodiments

The present disclosure in this specification and drawings is not limited to the exemplified embodiments. The present disclosure encompasses the illustrated embodiments and variations thereof by those skilled in the art. For example, the present disclosure is not limited to combinations of the parts and/or elements shown in the embodiments. The combinations of disclosure may be implemented in various combinations. The combinations of disclosure can have additional parts/portions that can be added to the embodiment. The present disclosure includes those in which the parts and/or elements of the embodiment are omitted. The present disclosure includes the reallocation or combination of parts and/or elements between one embodiment and another. The disclosed technical scope is not limited to the description of the embodiments. It should be understood that some of the disclosed technical scopes (i) are indicated by description of claims, and (ii) includes every modification within the equivalent meaning and the scope of description of claims.

The present disclosure in the specification, drawings and the like is not limited by the description of the claims. The present disclosures in the specification, the drawings, and the like encompass the technical ideas described in the claims, and further extend to a wider variety of technical ideas than those in the claims. Therefore, various technical ideas can be extracted from the present disclosure of the specification, the drawings and the like without being limited to the description of the claims.

When an element or a layer is described as "disposed above" or "connected", the element or the layer may be directly disposed above or connected to another element or another layer, or an intervening element or an intervening layer may be present therebetween. In contrast, when an element or a layer is described as "disposed directly above" or "directly connected", an intervening element or an intervening layer is not present. Other terms used to describe the relationships between elements (for example, "between" vs. "directly between", and "adjacent" vs. "directly adjacent") should be interpreted similarly. As used herein, the term "and/or" includes any combination and all combinations relating to one or more of the related listed items. For example, the term A and/or B includes only A, only B, or both A and B.

Spatial relative terms "inside", "outside", "back", "bottom", "low", "top", "high", etc. are used herein to facilitate the description that describes relationships between one element or feature and another element or feature. Spatial relative terms can be intended to include different directions of a device in use or operation, in addition to the directions depicted in the drawings. For example, when the device in the drawing is flipped over, an element described as "below" or "directly below" another element or feature is directed "above" the other element or feature. Therefore, the term "below" can include both above and below. The device may be oriented in the other direction (i.e., rotated 90 degrees or in any other direction) and the spatially relative terms used herein are interpreted accordingly.

Examples have been shown in which a microcomputer or IC provides means and/or functions, but the present disclosure is not limited thereto. It may be implemented by a dedicated computer that uses a processor programmed to perform one or more functions embodied by a computer program. Further, it may be realized by using a dedicated hardware logic circuit. Further, it may be realized by one or more dedicated computers configured by a combination of a processor that executes a computer program and one or more hardware logic circuits. The computer program may also be stored in a computer-readable, non-transitory, tangible recording medium as instructions to be performed by a computer. Means and/or functions can be provided by software recorded in a substantive memory device and the computer executing such software, software only, hardware only, or a combination thereof. For example, some or all of the functions provided by the processor may be realized as hardware. A mode in which a certain function is realized as hardware includes a mode in which one or more ICs are used. The processor may be realized by using MPU, GPU, DFP instead of CPU. The processor may be realized by combining a plurality of types of arithmetic processing units such as a CPU, an MPU, and a GPU. The processor may be implemented as a system on chip (SoC). Further, various processing units may be realized by using FPGA or ASIC. The various programs may be stored in a non-transitory, substantive recording medium. DFP, which can adopt various storage media such as HDD, SSD, flash memory, and SD card as the storage medium of the program, is an abbreviation for Data Flow Processor. SoC is an abbreviation for System on Chip. FPGA is an abbreviation for Field Programmable Gate Array. ASIC is an abbreviation for Application Specific Integrated Circuit. HDD is an abbreviation for Hard disk Drive. SSD is an abbreviation for Solid State Drive. SD is an abbreviation for Secure Digital.

Figure 18:
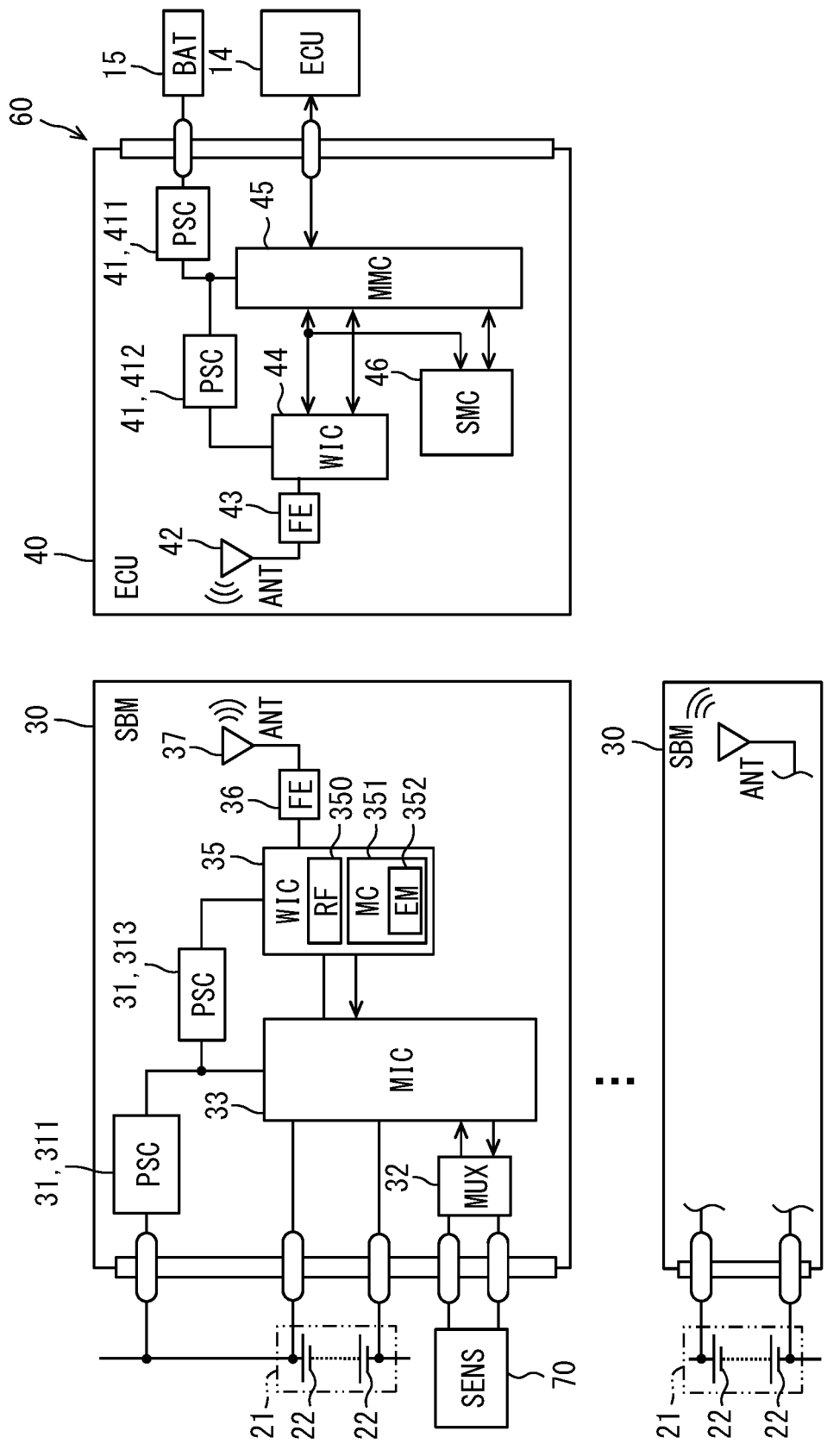
FIG. 18 is a block diagram showing another example of the configuration of a battery management system.

For example, an example in which the monitoring device 30 includes the microcomputer 34 has been shown, but the present disclosure is not limited to the above. As shown in FIG. 18, a battery management system 60 having a configuration in which the monitoring device 30 does not include the microcomputer 34 may be adopted. FIG. 18 corresponds to FIG. 14. In this configuration, the wireless IC 35 transmits/receives data to/from the monitoring IC 33. The wireless IC 35 may perform the sensing by using the monitoring IC 33 and the schedule control of the self-diagnosis, or the main microcomputer 45 of the control device 40 may perform the same.

The arrangement and number of the battery stack 21 and the battery cell 22 constituting the assembled battery 20 are not limited to the above examples. In the battery pack 11, the arrangement of the monitoring device 30 and/or the control device 40 is not limited to the above examples.

Figure 19:
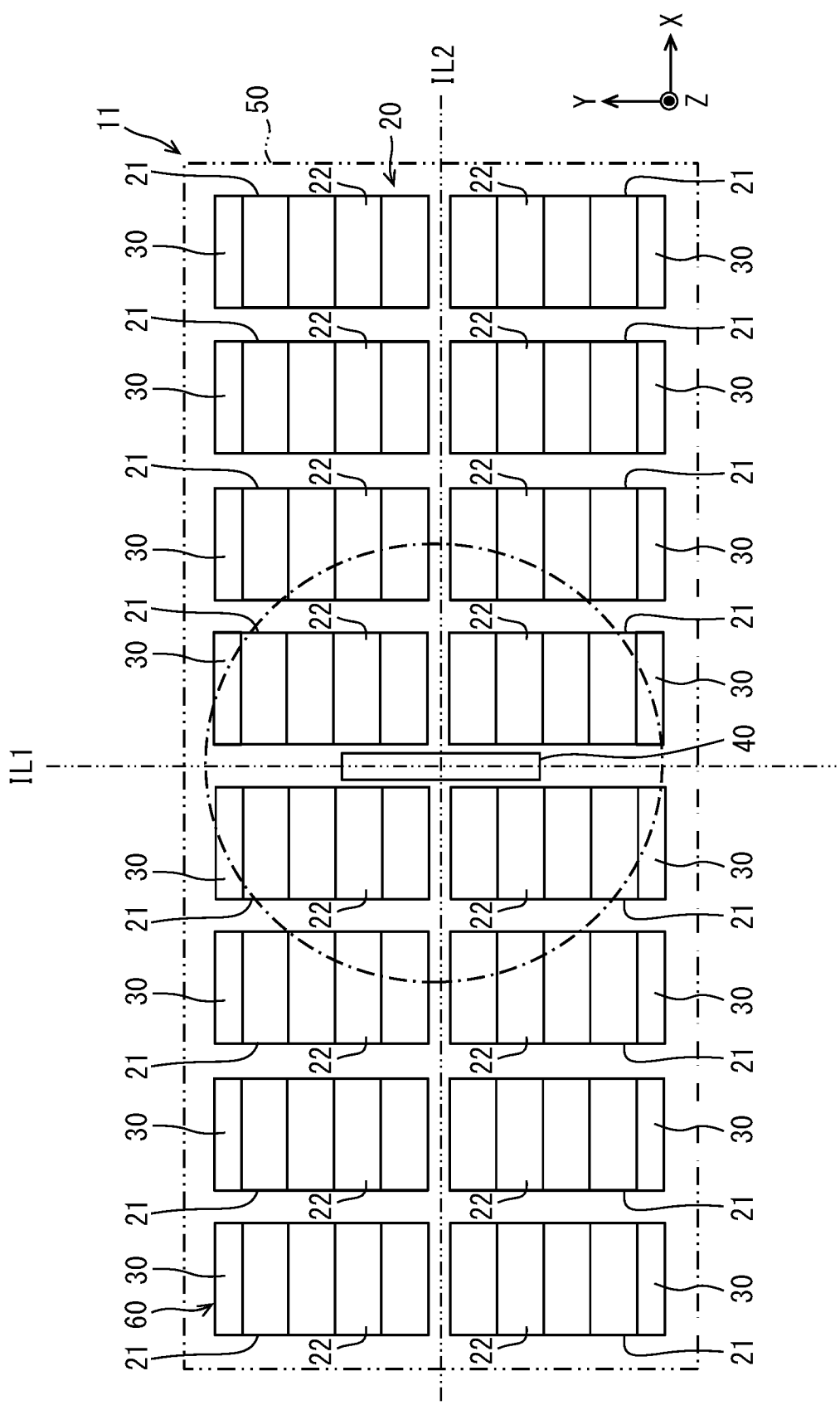
FIG. 19 is a diagram showing another example of the positional relationship between the monitoring device and the control device.

For example, in an example shown in FIG. 19, two battery stacks 21 are arranged side by side in the Y direction to form a pair. Then, stack rows of paired battery stacks 21 are arranged side by side in the X direction. In FIG. 19, the battery pack 11 has eight stack rows. The monitoring device 30 is provided in each of the battery stacks 21. The monitoring device 30 is provided on the side surface of the battery stack 21 in the Y direction, which is opposite to the facing surface of the paired battery stacks 21. The control device 40 is arranged substantially at the center of the plurality of stack rows in the X direction. The control device 40 is arranged substantially at the center of the pair of battery stacks 21 in the Y direction.

In a plan view, the four monitoring devices 30 are arranged at different positions on the circumference of a virtual circle centered on the control device 40. In FIG. 19, for convenience, only one virtual circle is shown, but the virtual circles are concentric circles, and four monitoring devices 30 are arranged on the circumference of each circle.

Further, in a plan view, the two monitoring devices 30 are arranged line-symmetrically with respect to a virtual straight line IL1 passing through the control device 40. Further, the two monitoring devices 30 are arranged line-symmetrically with respect to a virtual straight line IL2 passing through the control device 40. The straight line IL1 is a straight line substantially parallel to the Y direction, and the straight line IL2 is a straight line substantially parallel to the X direction. Further, in a plan view, the control device 40 is arranged at a midpoint of the two monitoring devices 30.

An example in which the monitoring device 30 is arranged for each battery stack 21 has been shown, but the present disclosure is not limited to the above. For example, one monitoring device 30 may be arranged for a plurality of battery stacks 21. A plurality of monitoring devices 30 may be arranged for one battery stack 21.

An example is shown in which the battery pack 11 includes one control device 40, but the present disclosure is not limited to the above. A plurality of control devices 40 may be provided. That is, the battery pack 11 may include one or more control devices 40. The battery management system 60 may include a plurality of sets of wireless communication systems constructed between one control device 40 and a plurality of monitoring devices 30.

An example is shown in which the monitoring device 30 includes one monitoring IC 33, but the present disclosure is not limited to the above. A plurality of monitoring ICs 33 may be provided. In such case, one wireless IC 35 may be provided for each monitoring IC 33, or one wireless IC 35 may be provided for a plurality of monitoring ICs 33.

Although all the monitoring devices 30 that perform wireless communication with the control device 40 have an event management unit 352 in the above-described example, only two monitoring devices 30 may have an event management unit 352, for example. In the two monitoring devices 30 respectively having the event management unit 352, it is possible to suppress the occurrence of radio wave interference at the time of start-up. That is, two or more monitoring devices 30 may have an event management unit 352. Since the event management units 352 manage the generation cycle of the advertising event so as to perform the advertising operation at respectively different timings, radio wave interference occurring at the time of start-up in the two or more monitoring devices 30 having the event management unit 352 is suppressible.

The monitoring IC 33 is also known as a "monitor cell supervisor".

The microcomputer 34 is also known as a "monitor computer".

The wireless circuit unit 35 is also known as a "monitor transceiver".

What is claimed is:

1. A battery management system comprising:
monitoring devices arranged in a housing for accommodating batteries, wherein each monitoring device includes:
   (i) a monitoring circuit capable of acquiring battery information indicative of a state of battery, and
   (ii) a monitor transceiver capable of performing wireless communication by transmitting and receiving data to and from the monitoring circuit; and
a control device performing a predetermined process based on the battery information by performing wireless communication with respective monitor transceivers in the monitoring devices, wherein
at a start-up time of the monitoring devices, each of the monitor transceivers performs an advertising operation in a cyclic advertising event in order to establish a connection of wireless communication between the monitoring devices and the control device, and the control device performs a scan operation, each of the monitor transceivers of the two or more monitoring devices has a respective event management unit that manages a generation cycle of the advertising event so as to perform the advertising operation at respectively different timings, after a first advertising event, the generation cycle of the advertising event is a fixed value among two or more of the monitoring devices each including the event management unit.

2. The battery management system of claim 1, wherein the monitoring devices having the event management unit are arranged at different positions on a circumference of a virtual circle centered on the control device.

3. The battery management system of claim 2, wherein the virtual circle includes concentric circles, and
the two or more monitoring devices having the event management unit are arranged on the circumference of each of the concentric circles.

4. The battery management system of claim 1, wherein the monitoring devices having the event management unit include a first monitoring device and a second monitoring device, and
the control device is arranged at a midpoint between the first monitoring device and the second monitoring device.

5. The battery management system of claim 1, wherein the monitoring devices having the event management unit include a third monitoring device and a fourth monitoring device, and
the third monitoring device and the fourth monitoring device are line-symmetrically arranged with respect to a virtual straight line that passes through the control device.

6. The battery management system of claim 1, wherein the event management unit sets the generation cycle of the advertising event so that a generation timing of a first advertising event after a start-up with reference to a start-up of the monitor transceiver is respectively different in each of the monitor transceivers.

7. The battery management system of claim 1, wherein after connection of wireless communication between one of the monitoring devices having the event management unit and the control device is disconnected, the event management unit of the monitoring device that re-establishes connection sets a shorter cycle of the generation cycle of the advertising event than that at the time of start-up.

8. The battery management system of claim 1, wherein each monitoring device has, in advance, identification information of the control device to be connected, and, when connection between all the monitoring devices and the control device is established, each monitoring device stops the advertising operation, and
the control device has, in advance, identification information of each monitoring device to be connected, and stops the scan operation when connection with all the monitoring devices having the identification information is established.

9. The battery management system of claim 1, wherein the control device is arranged in the housing.

* * * * *